(12) United States Patent
Martinez et al.

(10) Patent No.: US 11,830,692 B2
(45) Date of Patent: Nov. 28, 2023

(54) ENHANCED TRIPPING SOLENOID FOR A MINIATURE CIRCUIT BREAKER

(71) Applicant: Schneider Electric USA, Inc., Andover, MA (US)

(72) Inventors: Leonardo Rangel Martinez, Iowa City, IA (US); Skylar Frances Wetzel, Cedar Rapids, IA (US); Juan Ignacio Melecio Ramirez, Coralville, IA (US)

(73) Assignee: Schneider Electric USA, Inc., Boston, MA (US)

( * ) Notice: Subject to any disclaimer, the term of this patent is extended or adjusted under 35 U.S.C. 154(b) by 185 days.

(21) Appl. No.: 17/386,193

(22) Filed: Jul. 27, 2021

(65) Prior Publication Data

US 2023/0032747 A1 Feb. 2, 2023

(51) Int. Cl.
| | |
|---|---|
| *H01H 47/00* | (2006.01) |
| *H01H 50/44* | (2006.01) |
| *G01R 31/327* | (2006.01) |
| *H01H 50/08* | (2006.01) |
| *H01H 50/18* | (2006.01) |

(52) U.S. Cl.
CPC ....... *H01H 47/002* (2013.01); *G01R 31/3275* (2013.01); *H01H 50/08* (2013.01); *H01H 50/18* (2013.01); *H01H 50/44* (2013.01)

(58) Field of Classification Search
CPC . G01R 31/3275; H01F 2027/406; H01F 7/06; H01F 27/402; H01H 47/002
See application file for complete search history.

(56) References Cited

U.S. PATENT DOCUMENTS

| | | |
|---|---|---|
| 3,054,976 A | 9/1962 | Lipshutz |
| 4,808,958 A | 2/1989 | Hewitt et al. |
| 5,541,800 A * | 7/1996 | Misencik ............... H01H 83/04 |
| | | 361/45 |
| 6,577,133 B1 | 6/2003 | Barron |
| 7,317,371 B1 | 1/2008 | Carroll |
| 7,605,585 B2 | 10/2009 | Gualtieri |
| 7,986,501 B2 | 7/2011 | Kamor et al. |
| 10,062,535 B2 | 8/2018 | Simonin |
| 10,326,264 B1 | 6/2019 | Gass et al. |
| 10,332,675 B2 | 6/2019 | Esakki et al. |
| 10,514,419 B2 | 12/2019 | Reid |
| 10,535,484 B2 | 1/2020 | Fleege |
| 2004/0075963 A1* | 4/2004 | Liu ........................ H02H 3/105 |
| | | 361/42 |

(Continued)

*Primary Examiner* — Jermele M Hollington
*Assistant Examiner* — Temilade S Rhodes-Vivour
(74) *Attorney, Agent, or Firm* — Locke Lord LLP

(57) ABSTRACT

A state of a tripping solenoid in a circuit breaker is determined by a primary coil and a secondary coil wound around a hollow body of a solenoid. The secondary coil is positioned within magnetic coupling distance from the primary coil and is configured to produce a sensing voltage based on the primary coil voltage. A ferromagnetic plunger positioned in the hollow body, is configured to slide axially to a tripped position to trip the circuit breaker when a trip voltage is applied to the primary coil. A plunger position detecting circuit connected to the secondary coil, is configured to detect the position of the plunger in the hollow body of the solenoid based on the sensing voltage. A reduction or absence of the sensing voltage indicates a faulty or broken connection in the primary coil.

12 Claims, 15 Drawing Sheets

(56) References Cited

U.S. PATENT DOCUMENTS

| | | | |
|---|---|---|---|
| 2008/0012677 A1* | 1/2008 | Colsch | H01F 38/30 336/178 |
| 2009/0122453 A1* | 5/2009 | Vicente | H01H 71/7409 361/93.3 |
| 2009/0174508 A1* | 7/2009 | Watford | H01H 71/02 335/38 |
| 2014/0071575 A1 | 3/2014 | Parker et al. | |
| 2016/0033306 A1 | 2/2016 | Hubbell | |

* cited by examiner

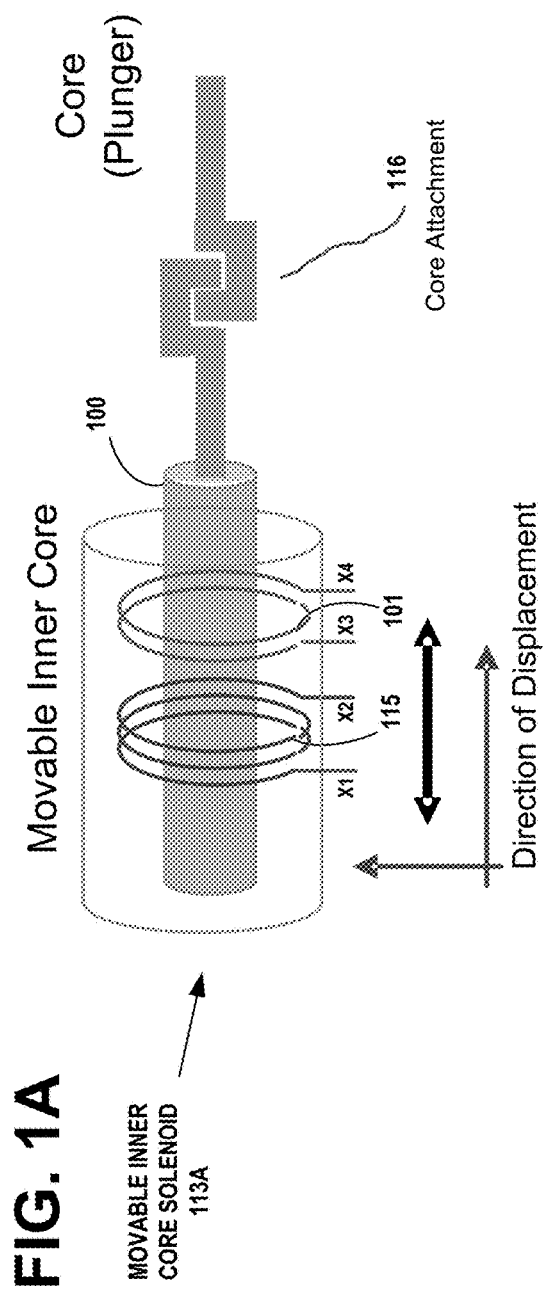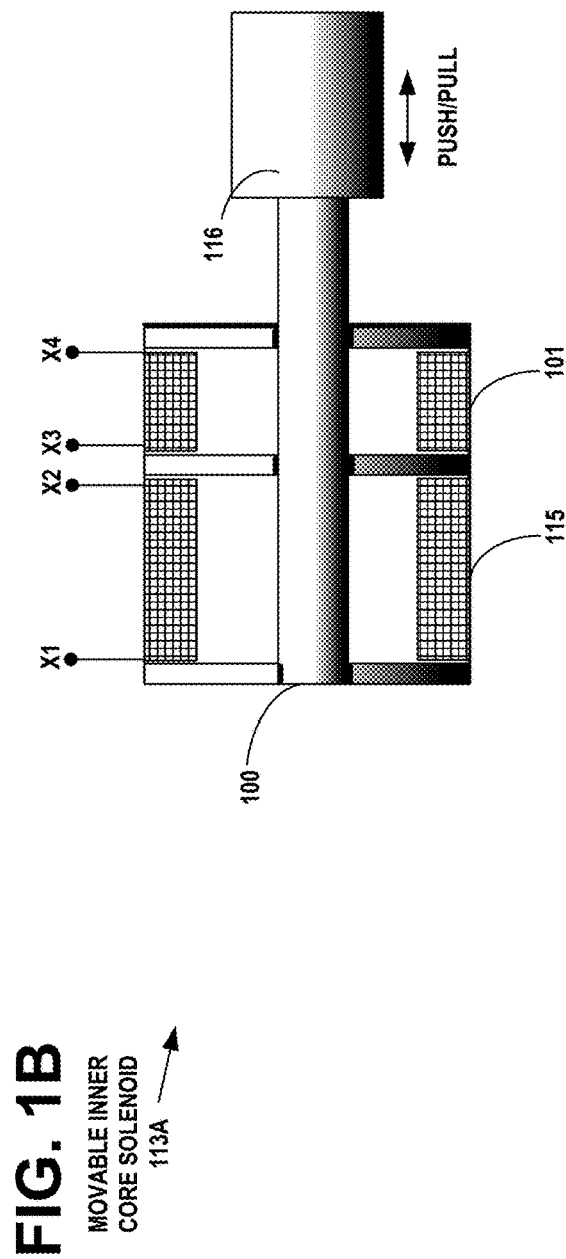
FIG. 1A
MOVABLE INNER CORE SOLENOID 113A
FIG. 1B
MOVABLE INNER CORE SOLENOID 113A

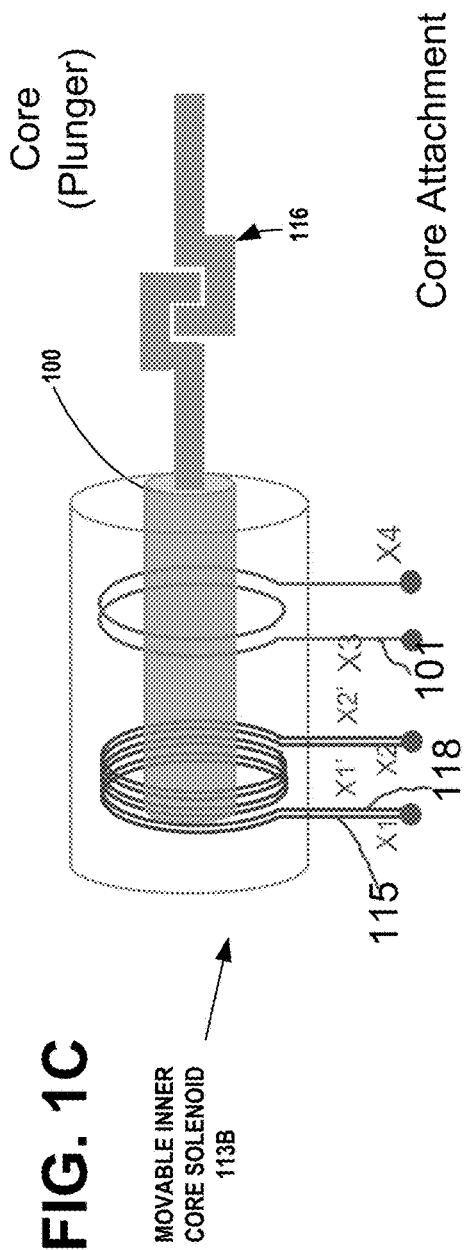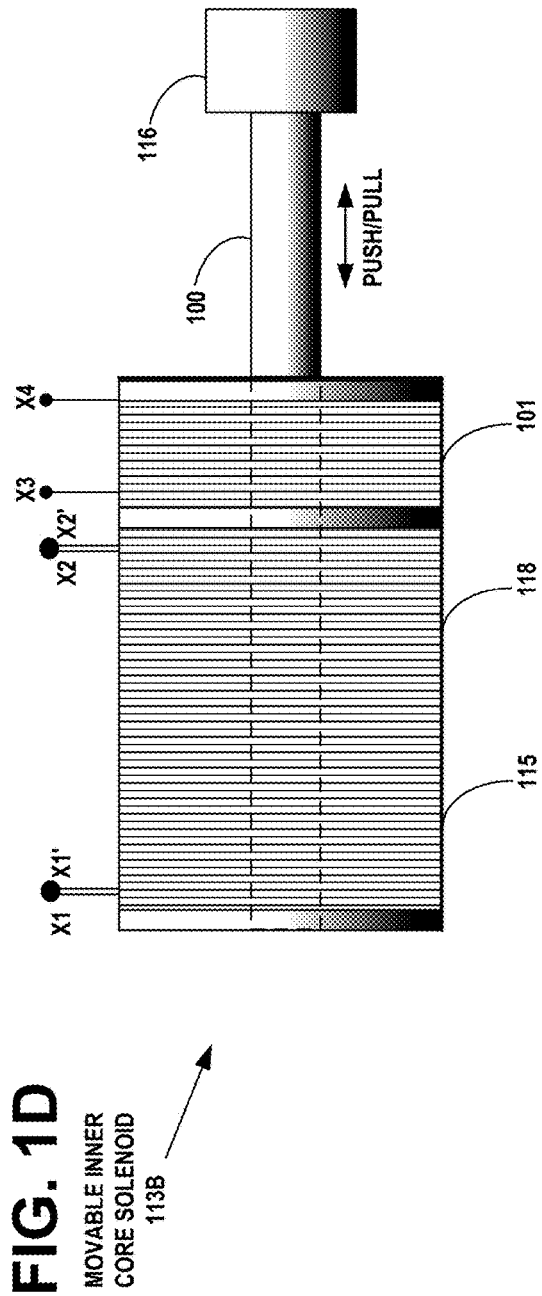

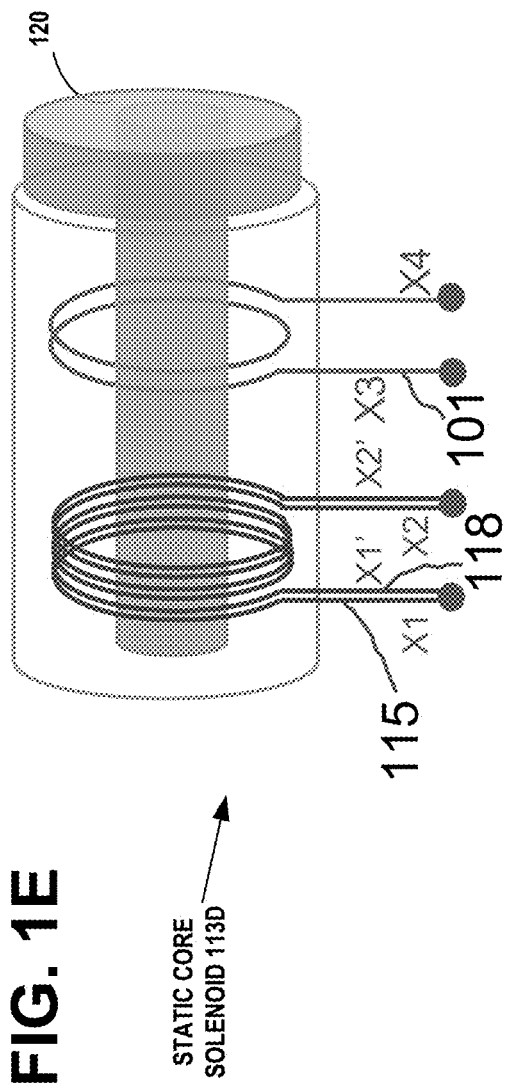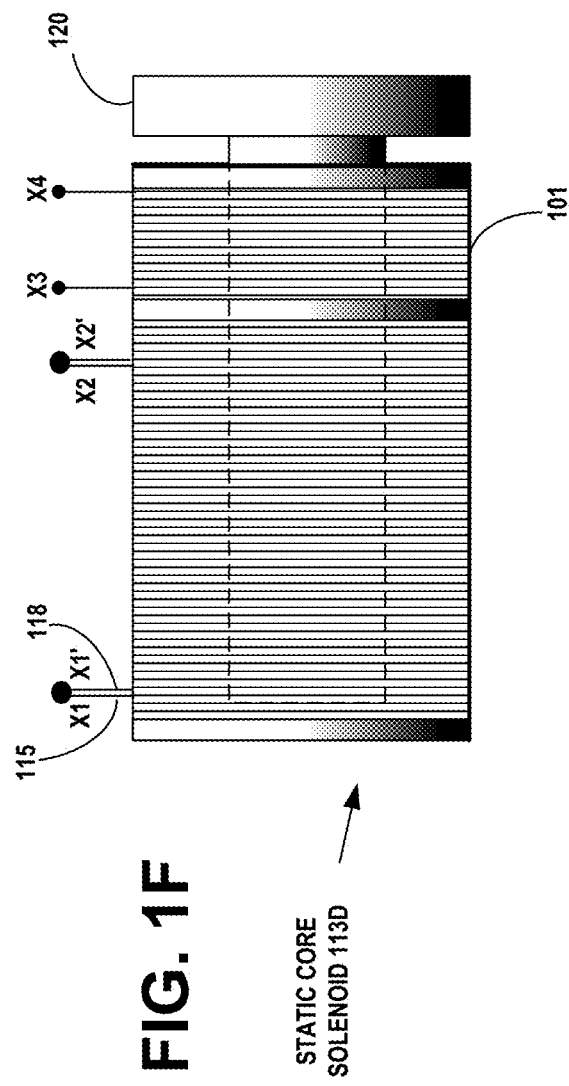

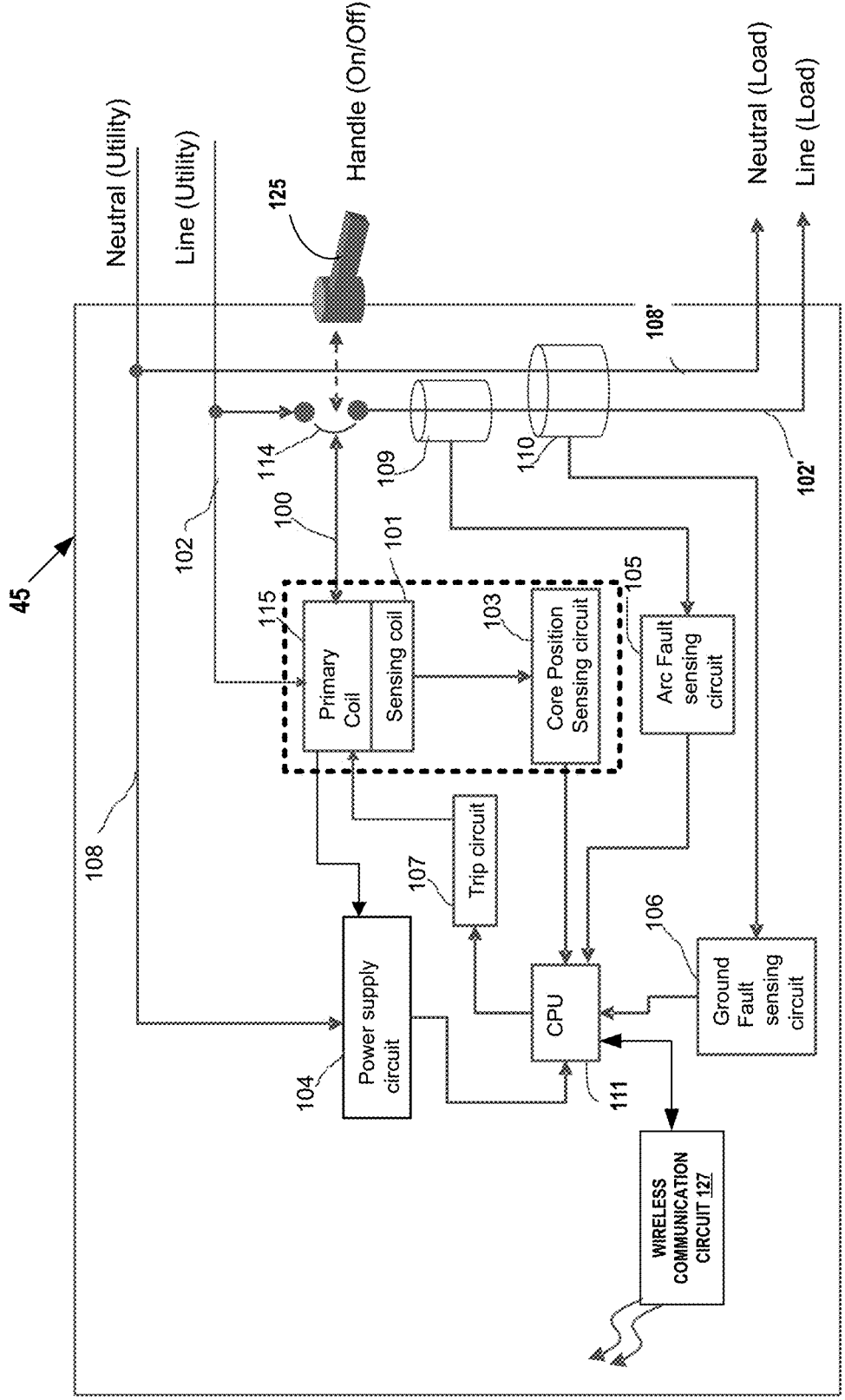

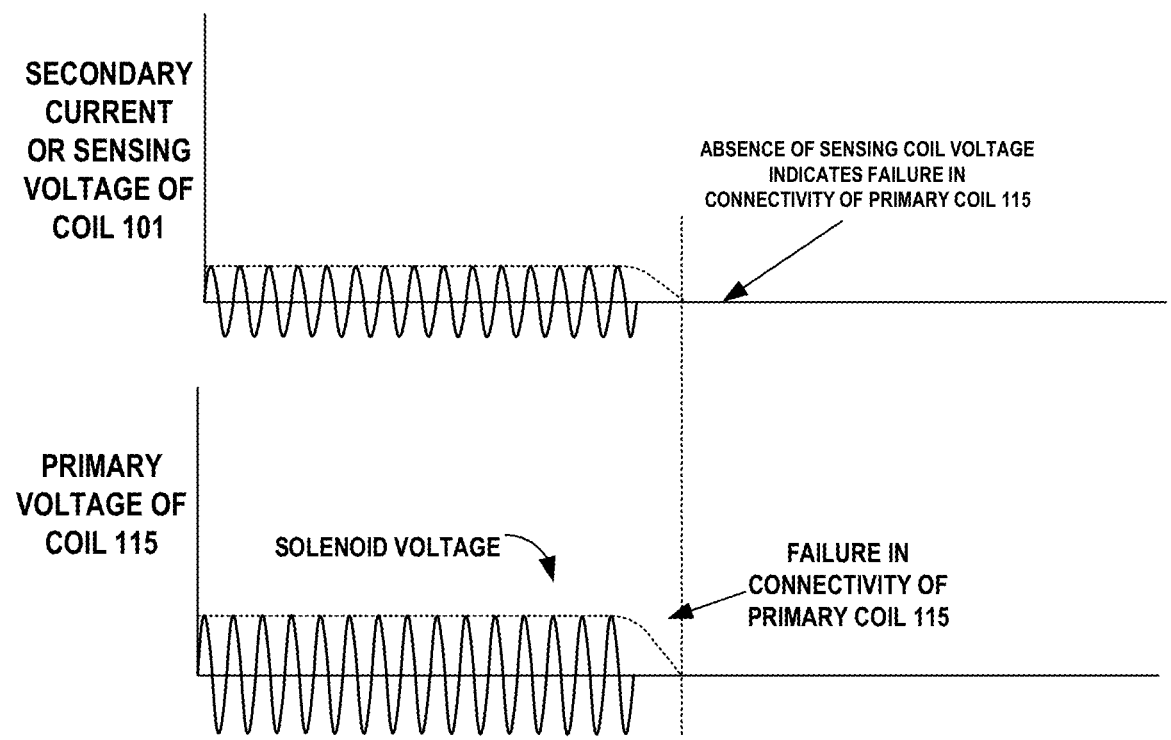

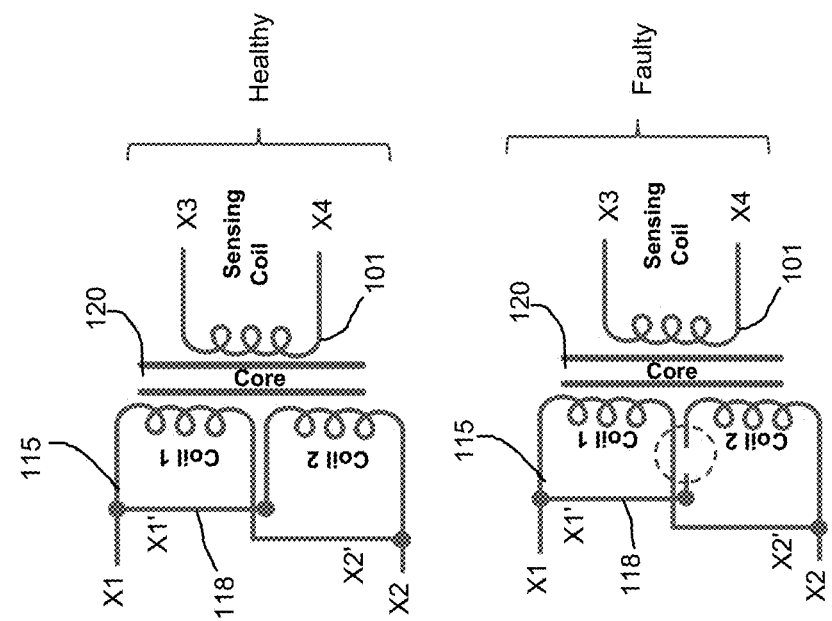
FIG. 5B
STATIC CORE SOLENOID 113D
FIG. 5C
STATIC CORE SOLENOID 113D
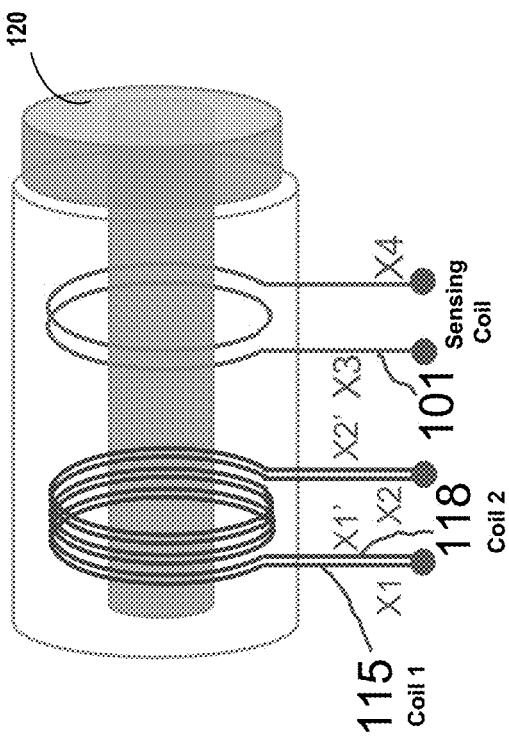
FIG. 5A
STATIC CORE SOLENOID 113D

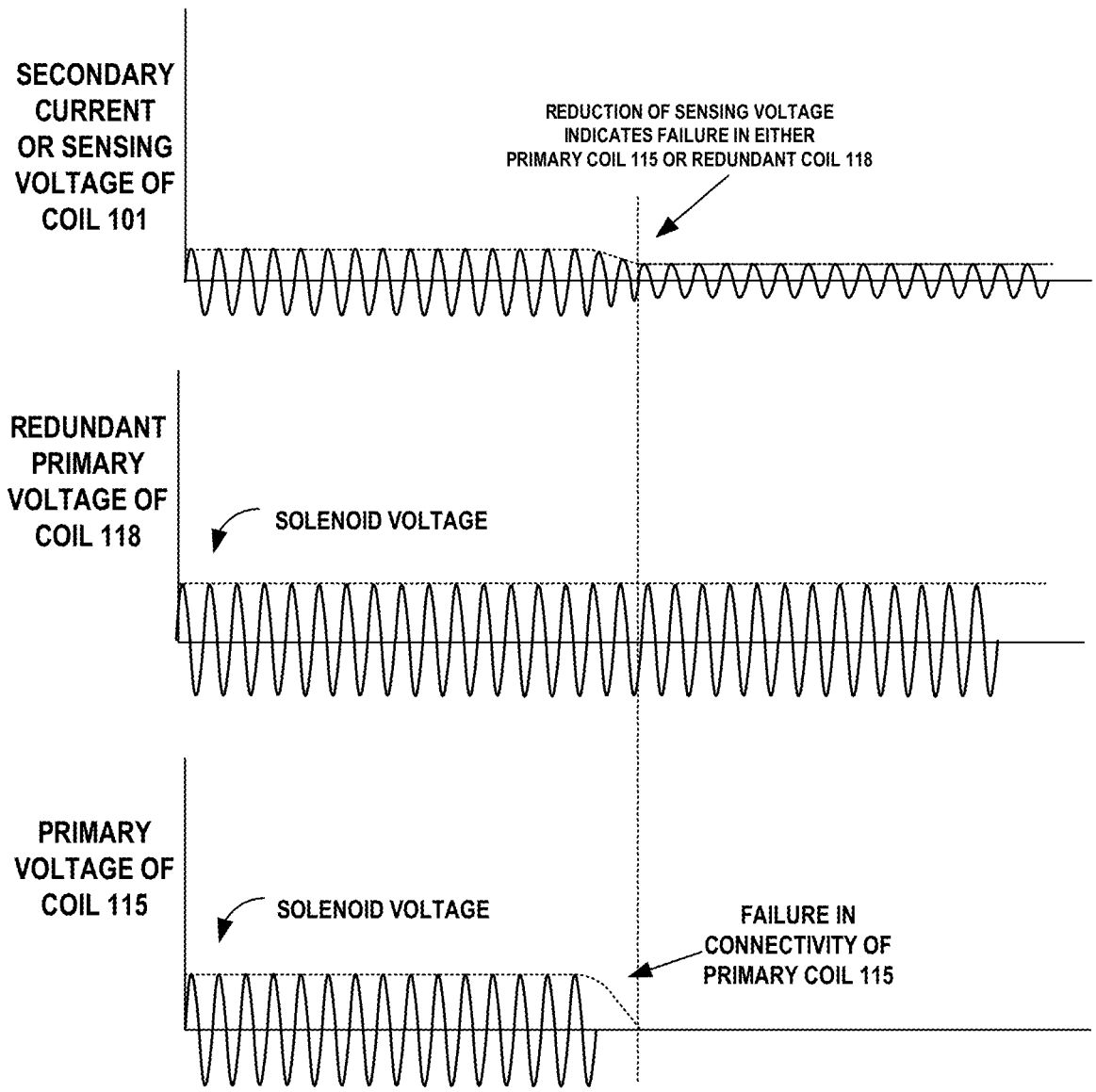

ENHANCED TRIPPING SOLENOID FOR A MINIATURE CIRCUIT BREAKER

TECHNICAL FIELD

This invention is directed generally to circuit breakers, and, more particularly, to an apparatus for detecting and reporting both electrical and mechanical states of a tripping solenoid in a circuit breaker.

BACKGROUND

Circuit breakers are conventionally used to protect electric power distribution circuits against arcing faults, ground faults, short circuit faults, and/or overloads. Typically, miniature circuit breakers are used particularly to protect branch circuits in homes and in commercial and light industry applications. For example, the miniature circuit breakers utilize an arc fault detector, a ground fault detector, a magnetic armature that is responsive to large magnetic forces generated by a short-circuit current, and/or a thermo-magnetic trip device that incorporates a bimetal responsive to persistent overload conditions.

Arcing faults are commonly defined as current through ionized gas between two ends of a broken conductor or at a faulty contact or connector, between two conductors supplying a load, between two conductors providing line-side power to a circuit breaker, between two conductor providing load-side power to a circuit breaker or between a conductor and ground. A combination arc-fault circuit interrupter (CAFI) device provides protection against parallel arcing in a circuit, which occurs when electricity jumps the gap between wires of different voltages. In addition, the CAFI device provides protection against series arcing in the circuit, which occurs when electricity jumps the gap between the strands within the same wire. A dual function (DF) CAFI device adds a ground-fault interrupter (GFI) function, which provides protection against electrical shock from ground-faults, which occur when electrical current passes outside of the circuit wires and through an external object connected to ground. CAFI devices and GFI devices are typically circuit interrupters that are designed to interrupt the electrical current or trip, if an arc-fault or a ground-fault is detected.

An arc fault detector in a circuit breaker outputs signals to a microcontroller in the circuit breaker when an arc fault is detected in a protected branch circuit. A ground fault detector in the circuit breaker outputs signals to the microcontroller in the circuit breaker when a ground fault is detected in a protected branch circuit. The microcontroller may store a trip code in a memory representing the detected fault condition, and then send a trip signal to a trip solenoid to cause a latching mechanism to separate the main contacts in the circuit breaker, thereby interrupting the current in the branch circuit. The trip solenoid receives electrical trip signals for fault events from the arc fault detector or the ground fault detector, via the microcontroller.

One configuration of a trip solenoid includes a wire coil wound around a hollow, cylindrical body or bobbin within which a sliding, cylindrical, ferromagnetic plunger moves axially within the hollow body. When the coil is energized with the electrical trip signals from the arc fault detector or ground fault detector, via the microcontroller, a magnetic field is created in the hollow body that moves the plunger into or out of hollow body, depending on the orientation of the coil and the magnetic poles of the plunger. The plunger is mechanically connected to the latching mechanism, which responds to the axial motion of the plunger, to open the main contacts of the circuit breaker and interrupt current in the branch circuit.

Short circuit faults and longer duration overload faults in the protected branch circuit are detected by thermal and magnetic trip units, typically a bimetal and magnetic yoke assembly in the circuit breaker. The bimetal and magnetic yoke assembly undergoes a small mechanical motion in response to a short circuit fault or overload fault. The bimetal and magnetic yoke assembly is linked to the latching mechanism, which responds to the mechanical motion of the bimetal and magnetic yoke assembly, to open the main contacts of the circuit breaker and interrupt current in the branch circuit. Typically, the bimetal and magnetic yoke assembly does not send electrical signals to the trip solenoid.

The status of the circuit breaker is typically indicated by the position of an actuating handle, which indicates whether the circuit breaker is in an ON position, OFF position, or TRIPPED position. The circuit breaker and its handle are tripped by the latching mechanism in response to mechanical movement of the bimetal and magnetic yoke assembly for short circuit and overload faults or in response to mechanical movement by the plunger in the trip solenoid for arc faults or ground faults. However, the microcontroller in a typical circuit breaker receives fault signals only from the arc fault detector or the ground fault detector via the microcontroller. Short circuit and thermal overload fault events are typically not signaled to the microcontroller. Also, the microcontroller is not alerted when there is a physical manipulation of the handle. The microcontroller will have to actively monitor the handle to detect the change.

What is needed, therefore, is a way to provide to the microcontroller, information on both electrical and mechanical states of the circuit breaker when a tripping event has occurred.

A second problem confronting circuit breaker designs is how to test the integrity of the solenoid coil and the signal wires from the microcontroller to the solenoid coil. If there were a break in the signal wires or a faulty connection therein, for example due to environmental degradation, the circuit breaker would likely fail to trip after detecting an arc fault or a ground fault condition.

What is needed, therefore, is a way to self-test the integrity of the electrical connections to the solenoid coil.

SUMMARY

In accordance with one example embodiment described herein, a state of a tripping solenoid in a circuit breaker is determined by a primary coil and a secondary coil wound around a hollow body or bobbin of a trip solenoid. The secondary coil is positioned within magnetic coupling distance from the primary coil and is configured to produce a sensing voltage based on the solenoid voltage and a trip voltage applied to the primary coil. In one embodiment, a ferromagnetic plunger positioned in the hollow body, is configured to slide axially to a tripped position to trip the circuit breaker when the trip voltage is applied to the primary coil. In another embodiment, a ferromagnetic plunger positioned in the hollow body, is configurate to slide axially to any position from any handle manipulation when the solenoid voltage is applied to the primary coil. A plunger position detecting circuit connected to the secondary coil, is configured to detect the position of the plunger in the hollow body of the solenoid based on the sensing voltage. A reduction or absence of the sensing voltage indicates a faulty or broken connection in the primary coil.

The primary coil in the solenoid is connected in series to the line voltage and the power supply in the circuit breaker, which is a constant AC solenoid voltage that maintains a constant level of primary current to provide a constant background magnetization of the primary coil. The secondary coil is positioned within magnetic coupling distance from the primary coil and has a secondary current or voltage induced therein when a primary current flows in the primary coil. The constant level AC solenoid voltage applied to the primary coil and the primary current therein, produces a constant level of magnetic coupling between the primary coil and the secondary coil in air or free space. However, when a portion of the magnetic field passes through the ferromagnetic material of the plunger, which has a relatively large magnetic permeability, the magnetic flux between the primary coil and the secondary coil becomes distorted toward the ferromagnetic material and becomes concentrated in the region of the ferromagnetic material through which it passes. Thus, the magnetic coupling between the primary coil and the secondary coil is affected by the position of the ferromagnetic plunger. In response, the magnitude of the secondary current or sensing voltage of the secondary coil indicates the position of the plunger in the hollow body of the solenoid. An absence or reduction of the secondary current or sensing voltage of the secondary coil indicates that there may be a faulty or broken connection in the primary coil.

In another embodiment, a static ferromagnetic plunger is positioned in the hollow body of the solenoid, configured to produce a magnetic field to cause the circuit breaker to trip when the trip voltage is applied to the primary coil. A detecting circuit is connected to the secondary coil, configured to detect an absence or reduction of the secondary current or sensing voltage of the secondary coil indicating a faulty or broken connection in the primary coil.

In accordance with one example embodiment described herein, an apparatus for determining a state of a tripping solenoid in a circuit breaker, comprises:
  a primary coil wound around a hollow body of a solenoid, the primary coil connected in series to the line voltage and the power supply, and coupled to a tripping circuit in a circuit breaker, the tripping circuit configured to apply a trip voltage to the primary coil when a fault condition is detected in a circuit monitored by the circuit breaker;
  a secondary coil wound around the hollow body of the solenoid, the secondary coil positioned within magnetic coupling distance from the primary coil, configured to produce a sensing voltage based on the based on the primary coil voltage;
  a ferromagnetic plunger positioned in the hollow body of the solenoid, configured to slide axially to a tripped position in the hollow body to trip the circuit breaker when the trip voltage is applied to the primary coil; and
  a plunger position detecting circuit connected to the secondary coil, configured to detect the position of the plunger in the hollow body of the solenoid based on the sensing voltage.

In accordance with one example embodiment described herein, the apparatus further comprises:
  a handle mechanically linked to the plunger of the solenoid, configured to adopt a position indicating that the circuit breaker has tripped or any change of state in the handle position, in response to the position of the plunger in the hollow body of the solenoid; and
  wherein the magnitude of the sensing voltage of the secondary coil indicates the position of the handle, in response to the position of the plunger in the hollow body of the solenoid.

In accordance with one example embodiment described herein, the apparatus further comprises:
  an absence or reduction of the sensing voltage of the secondary coil indicates a faulty or broken connection in the primary coil.

In accordance with one example embodiment described herein, the apparatus further comprises:
  a second primary coil wound around the hollow body of the solenoid, the second primary coil connected in parallel with the first said primary coil and positioned within magnetic coupling distance from the secondary coil;
  wherein an absence or reduction of the sensing voltage of the secondary coil indicates a faulty or broken connection in at least one of the first said primary coil and the second primary coil;
  wherein the magnitude of the sensing voltage of the secondary coil indicates the position of the handle, in response to the position of the plunger in the hollow body of the solenoid.

In accordance with one example embodiment described herein,
  a wireless or wired communication circuit coupled to the plunger position detecting circuit, configured to transmit information on at least one of electrical or mechanical states of the circuit breaker.

In accordance with one example embodiment described herein, an apparatus for determining a state of a primary coil of a trip solenoid in a circuit breaker, comprises:
  a primary coil wound around a hollow body of a solenoid, the primary coil connected in series to the line voltage and the power supply, and coupled to a tripping circuit in a circuit breaker, the tripping circuit configured to apply a trip voltage to the primary coil when a fault condition is detected in a circuit monitored by the circuit breaker;
  a secondary coil wound around the hollow body of the solenoid, the secondary coil positioned within magnetic coupling distance from the primary coil, configured to produce a sensing voltage based on the primary coil voltage;
  a static ferromagnetic plunger positioned in the hollow body of the solenoid, configured to produce a magnetic field to cause the circuit breaker to trip when the trip voltage is applied to the primary coil; and
  a detecting circuit connected to the secondary coil, configured to detect an absence or reduction of the sensing voltage of the secondary coil indicating a faulty or broken connection in the primary coil.

In accordance with one example embodiment described herein, the apparatus further comprises:
  a second primary coil wound around the hollow body of the solenoid, the second primary coil connected in parallel with the first said primary coil and positioned within magnetic coupling distance from the secondary coil;
  wherein an absence or reduction of the sensing voltage of the secondary coil indicates a faulty or broken connection in at least one of the first said primary coil and the second primary coil.

In accordance with one example embodiment described herein, the apparatus further comprises:

a computer processor and a memory programmed with computer instructions for execution by the processor, coupled to the secondary coil, configured to detect the position of the plunger in the hollow body of the solenoid based on the sensing voltage;

wherein the computer processor is programmed to determine whether any change in the sensing voltage indicates either a change in the position of the plunger within the hollow body of the solenoid or, alternately, an impending or actual failure of the primary coil.

wherein the processor is programmed to determine whether the sensing voltage has been reduced or is substantially zero, indicating one or both of the windings in the trip solenoid is faulty, but the circuit breaker will continue detect arc faults or ground faults, wherein the processor is configured to send an external signal through either a communicating circuit or an LED circuit to indicate a problem with the circuit breaker.

wherein the processor is programmed to determine whether the sensing voltage has changed and whether there is no indication of an arc fault or a ground fault, indicating that there has been a tripping event by either an over current, a short circuit, or any handle manipulation event that will have tripped a handle of the circuit breaker into its tripped position.

wherein the processor is programmed to determine whether an arc fault or a ground fault has occurred, and in response, causing a trip voltage pulse to be applied to the primary coil to move the plunger within the solenoid to trip the circuit breaker The resulting apparatus and system provide information on both electrical and mechanical states of the circuit breaker when a short circuit or overload fault event occurs. Moreover, the resulting apparatus and system can indicate that there is a broken or faulty connection in the primary coil.

BRIEF DESCRIPTION OF THE DRAWINGS

A more detailed description of the disclosure, briefly summarized above, may be had by reference to various embodiments, some of which are illustrated in the appended drawings. While the appended drawings illustrate select embodiments of this disclosure, these drawings are not to be considered limiting of its scope, for the disclosure may admit to other equally effective embodiments.

FIG. 1A illustrates an example moveable inner core solenoid 113A that is used for the trip solenoid in the miniature circuit breaker of FIG. 1, wherein the solenoid includes a single primary coil and a secondary coil, in an example embodiment of the disclosure.

FIG. 1B illustrates an interior view of the example moveable inner core solenoid of FIG. 1A, in an example embodiment of the disclosure.

FIG. 1C illustrates an example moveable inner core solenoid 113B that is used for a trip solenoid in a miniature circuit breaker, wherein the solenoid includes two primary coils that are in parallel (double winding solenoid), and a secondary coil, in an example embodiment of the disclosure.

FIG. 1D illustrates a side view of the example moveable inner core solenoid of FIG. 1C, in an example embodiment of the disclosure.

FIG. 1E illustrates an example static core solenoid 113D that is used for a trip solenoid in a miniature circuit breaker, wherein the solenoid includes two primary coils that are connected together in parallel, and a secondary coil, in an example embodiment of the disclosure.

FIG. 1F illustrates a side view of the example static core solenoid of FIG. 1E, in an example embodiment of the disclosure.

FIG. 3A illustrates an example schematic circuit diagram of the fault tripping components associated with the moveable inner core solenoid of FIG. 1A in a miniature circuit breaker, in an example embodiment of the disclosure.

FIG. 4C illustrates an example graph of the primary voltage and the secondary current and sensing voltage in monitoring the continuity of the primary coil in the moveable inner core solenoid 113A of FIG. 1A, wherein the solenoid includes a single primary coil and a secondary coil, in an example embodiment of the disclosure.

FIG. 5A illustrates an example static core solenoid 113D having a double winding with two primary coils and a secondary coil, in an example embodiment of the disclosure.

FIG. 5B illustrates an example schematic circuit diagram of the static core solenoid 113D of FIG. 5A, having a double winding with two primary coils, wherein the presence and magnitude of a secondary current in the secondary coil indicates that both of the two primary coils have good integrity, in an example embodiment of the disclosure.

FIG. 5C illustrates an example schematic circuit diagram of the static core solenoid 113D of FIG. 5A, having a double winding with two primary coils, wherein the absence or small magnitude of a secondary current in the secondary coil indicates that at least one of the two primary coils has a faulty or broken connection, in an example embodiment of the disclosure.

FIG. 7 illustrates an example graph of the primary voltage and the secondary current and sensing voltage in monitoring the continuity of both the primary coil and the redundant primary coil in the static core solenoid 113D of FIG. 5A, wherein the solenoid includes a double winding with two primary coils and the secondary coil, in an example embodiment of the disclosure.

DETAILED DESCRIPTION

When a miniature circuit breaker detects a ground fault, a grounded neutral fault, or an arc fault, collectively referred to as an electronic fault, its trip circuit sends a fault signal that energizes a trip solenoid, causing it to become magnetized. The winding of the trip solenoid is connected to the trip circuit that, when turned on, allows fault signal current to flow through and thereby energize the winding. Some types of trip solenoids, known as a moveable inner core solenoid, have a movable plunger that is mechanically linked to a trip mechanism. The plunger is magnetized by the energized winding of the solenoid, to move in an axial direction in the solenoid. The plunger operates to press against or pull on the trip mechanism in response to the winding being energized indicating a ground fault or an arc fault. When the plunger presses against or pulls on the trip mechanism, a trip lever is delatched, which separates a movable main contact from a stationary main contact in the circuit breaker, to open the circuit and remove power from the load in the branch circuit being monitored. An example of a trip solenoid with a movable plunger that is mechanically linked to a trip mechanism is described in U.S. Pat. No. 10,514,419 to Paul A. Reid, entitled "Method of Identifying a Mechanical Trip in an Electronic Miniature Circuit Breaker", issued Dec. 24, 2019, the disclosure of which is incorporated herein by reference.

Figure 1:
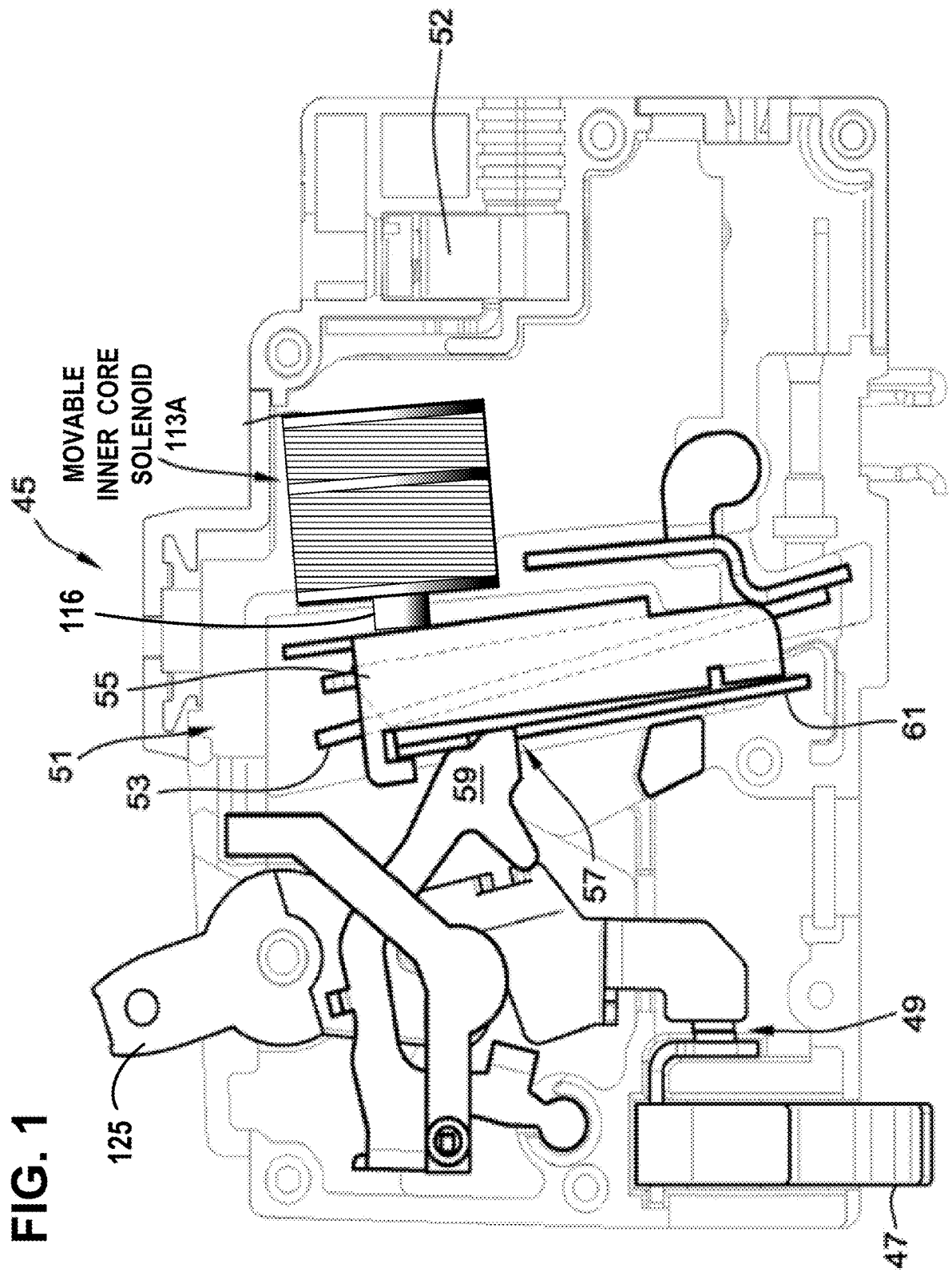
FIG. 1 shows a miniature circuit breaker in a latched position with an example moveable inner core solenoid 113A that is a trip solenoid, in an example embodiment of the disclosure.

FIG. 1 shows a miniature circuit breaker 45 in a latched position with an example moveable inner core solenoid 113A (FIGS. 1A and 1B) that is a trip solenoid, in an example embodiment of the disclosure. An example of the miniature circuit breaker 45 is the Dual Function Arc Fault/Ground Fault Circuit Interrupter type. The line current path of the breaker 45 starts at the line power terminal 47 of the breaker 45 and continues through the separable contacts 49 to the load terminal 52, which is wired out to a branch load (not shown). The circuit breaker 45 contains thermal and magnetic trip units 51, i.e. a bimetal 53 and a magnetic yoke 55 assembly, respectively, which are components for initiating the tripping of the breaker, i.e. separating of the contacts 49, in the event of overcurrent conditions. The incoming current path of the breaker 45 contains a latch 57, which operates the separable contacts 49 by either of the thermal/magnetic trip assembly 51 or the trip solenoid 113A. The latching mechanism 57 for a trip event comprises the spring-biased trip lever 59 anchored in the latch plate 61, which is connected to magnetic yoke 55 when the separable contacts collectively 49 are together. Separating the latch plate 61 from the trip lever 59 causes the trip event, i.e. separation of the separable contacts. Once the trip lever 59 separates from the latch plate 61, the free end of the trip lever 59 is pulled downward by a spring bias allowing the contacts 49 to separate.

When an arc fault is detected by the arc fault detector 105 or a ground fault is detected by the ground fault detector 106 (FIG. 3B) in the circuit breaker, it signals the CPU 111 that outputs an actuating signal that energizes the trip solenoid 113A, causing the plunger 100 (FIG. 1B) to become magnetized. The energized primary coil 115 (FIG. 1B) of the trip solenoid 113A magnetizes the plunger 100 to move in an axial direction in the solenoid 113A. The plunger 100 and core attachment 116 operate to pull on the yoke 55 of the trip mechanism 114 in response to the primary coil 115 being energized, indicating an arc fault. When the plunger 100 pulls on the trip mechanism 114, the trip lever 59 is delatched, which separates the main contacts 49 to open the circuit and remove power from the load in the branch circuit being monitored. A mechanical link to the handle 125 causes the handle to move to a position to indicate a trip fault. For a thermal trip, the bimetal 53 within the yoke 55 is distorted by resistive heating heat and forces the latch plate 61 away from the trip lever 59.

Since the plunger 100 is mechanically fastened to the yoke 55 on the trip mechanism 114, whenever the trip lever 59 is delatched, the plunger travels with the motion of the yoke 55. Thus, whenever the trip lever 59 is delatched, whether as a result of a short circuit or over current fault, or as a result of an arc or ground fault, the position of the plunger is moved from its neutral position to a tripped position.

FIG. 1A illustrates an example moveable inner core solenoid 113A that is used as a trip solenoid in a miniature circuit breaker. The solenoid 113 includes a single primary coil 115 and a secondary coil 101, in an example embodiment of the disclosure. FIG. 1B illustrates an interior view of the example moveable inner core solenoid 113A of FIG. 1A. The primary coil 115 and the secondary coil 101 are wound about a hollow bobbin body that has a generally cylindrical shape and is made of a non-metallic, non-conductive material. A front wall forms one end of the bobbin and a rear wall forms the other end of the bobbin. A disk shaped divider is located on the bobbin between the front wall and the rear wall coaxial with the bobbin, which serves to separate the secondary coil 101 from the primary coil 115. The secondary coil 101 is positioned within magnetic coupling distance from the primary coil 115, to produce a secondary current when a primary current flows in the primary coil 115.

A ferromagnetic metallic plunger 100 is mounted within the hollow bobbin body, which becomes magnetized in the presence of a magnetic field. The magnetic field that forms around the primary coil 115 when the actuating primary current flows in the coil, draws the plunger 100 into the central portion of the interior of the hollow bobbin body. The plunger 100 is movable within the bobbin and drives a core attachment 116 to pull on the yoke 55 of the trip mechanism 114 in response to the primary coil 115 being energized indicating a ground fault or an arc fault. The plunger 100 slides axially in the hollow bobbin body to trip the circuit breaker when a trip voltage pulse or actuating signal is applied to the primary coil 115. The resulting primary current in the primary coil 115 has a magnitude sufficient to magnetize and propel the moveable plunger 100 and core attachment 116 to pull on the yoke 55 of the trip mechanism 114, to thereby open the main contacts of the circuit breaker. Since the plunger 100 and core attachment 116 are mechanically fastened to the yoke 55 of the trip mechanism 114, whenever the trip lever 59 is delatched, the plunger 100 travels with the motion of the yoke 55. Thus, whenever the trip lever 59 is delatched and the contacts opened, whether as a result of a short circuit or over current fault, or as a result of an arc fault or ground fault, the position of the plunger 100 is moved from its neutral position to its tripped position within the central portion of the interior of the hollow bobbin body. FIG. 1B shows the plunger in its neutral position outside of the central portion of the interior of the bobbin body.

The magnetic coupling between the primary coil 115 and the secondary coil 101 is affected by the position of the ferromagnetic plunger 100. In an example embodiment, as the plunger 100 moves toward the secondary coil 101, the induced voltage in the secondary coil 101 increases and as the plunger 100 moves away from the secondary coil 101, the induced voltage in the secondary coil 101 decreases. In response, the magnitude of the secondary voltage in the secondary coil 101 indicates the position of the plunger 100 in the hollow body of the solenoid 113A.

In another embodiment, the plunger 100 is movable within the bobbin and drives a core attachment 116 to push on the trip mechanism in response to the primary coil 115 being energized indicating a ground fault or an arc fault. The plunger 100 slides axially in the hollow bobbin body to trip the circuit breaker when the trip voltage pulse or actuating signal is applied to the primary coil 115. The resulting primary current in the primary coil 115 has a first magnitude sufficient to magnetize and propel the moveable plunger 100 to push the core attachment 116 against the yoke 55 of the trip mechanism 114, to thereby open the main contacts of the circuit breaker.

Figure 3B:
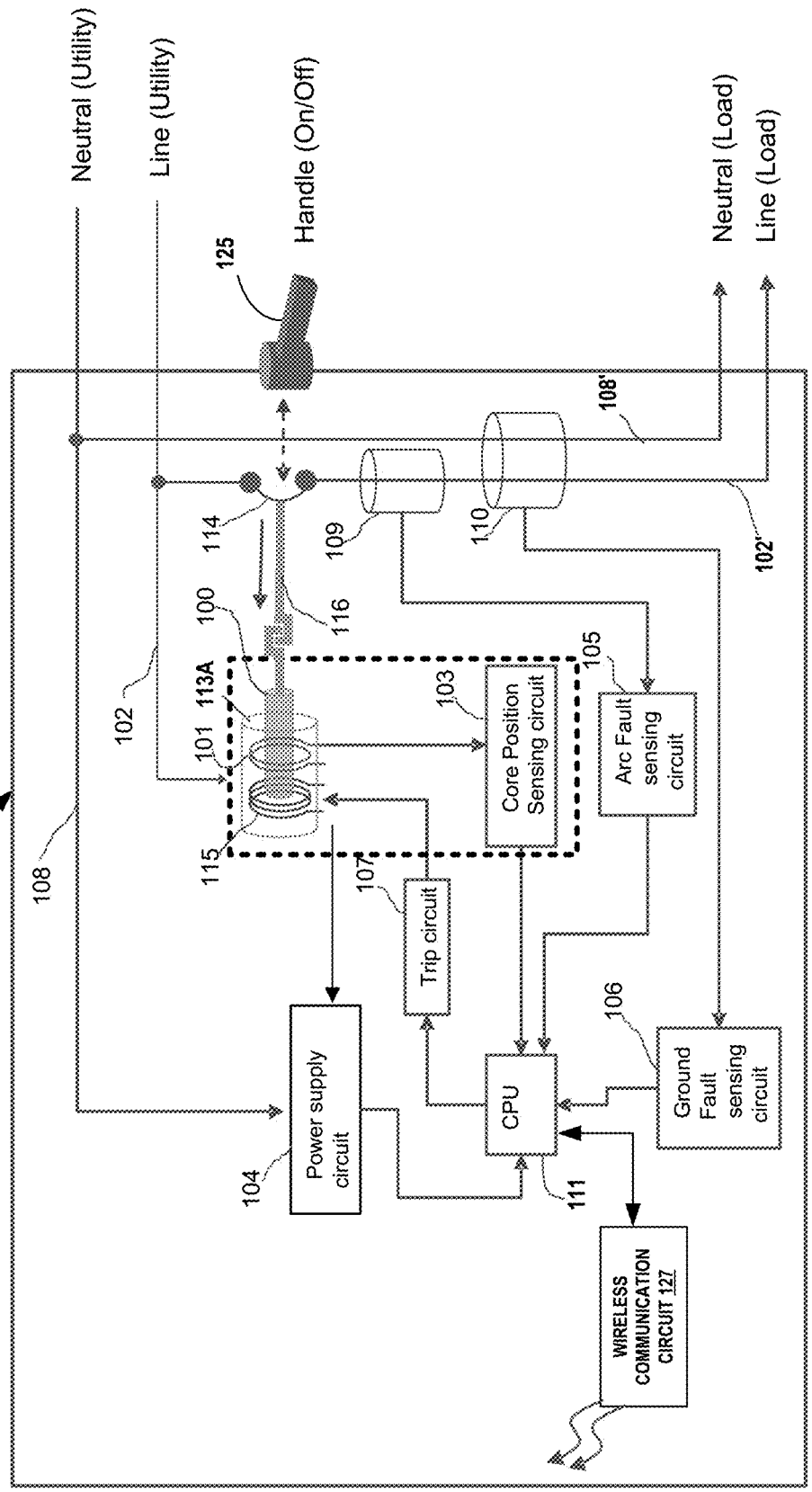
FIG. 3B illustrates an example schematic circuit diagram of the fault tripping components associated with the moveable inner core solenoid 113A of FIG. 1A, showing details of a single primary coil and a secondary coil, wherein a magnitude of the secondary current in the secondary coil indicates a position of the moveable inner core of the solenoid in a miniature circuit breaker, in an example embodiment of the disclosure.

FIG. 3A illustrates an example schematic circuit diagram of the fault tripping components associated with the moveable inner core solenoid 113A of FIG. 1A in the miniature circuit breaker 45, in an example embodiment of the disclosure. FIG. 3B illustrates an example schematic circuit diagram of the fault tripping components associated with the moveable inner core solenoid 113A of FIG. 1A, showing details of the single primary coil 115 and the secondary coil 101. A magnitude of the secondary current or sensing voltage of the secondary coil 101 indicates a position of the moveable inner core plunger 100 of the solenoid 113A, in an example embodiment of the disclosure.

Figure 3C:
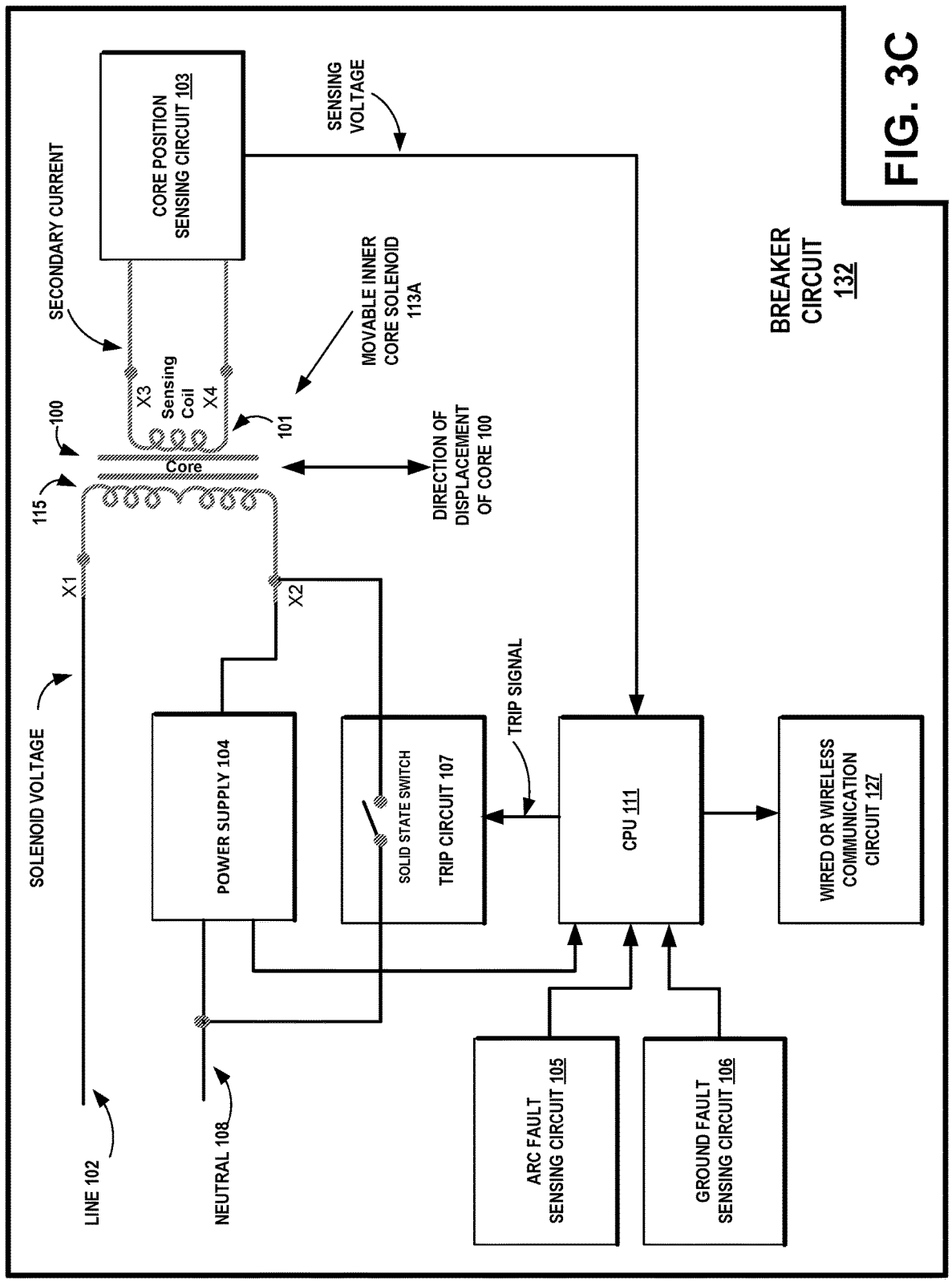
FIG. 3C illustrates a more detailed example schematic circuit diagram of FIG. 3B, showing details of connection of the primary coil and sensing coil to the rest of the breaker circuit, illustrating the connection of the primary coil and the connection of the secondary coil to the core position sensing circuit of the solenoid in a miniature circuit breaker, in an example embodiment of the disclosure.

The primary coil 115 in the solenoid 113A is connected by just terminal X2 to the trip or tripping circuit 107 of FIG. 3C. An arc fault is sensed the current transformer 109 on the utility/load line 102/102' and the arc fault indication is output to the arc fault sensing circuit 105. A ground fault is sensed by the current transformer 110 on the combined utility/load lines 102/102' and the neutral utility/load line 108/108' and the ground fault indication is output to the ground fault sensing circuit 106. Fault detection signals from the arc fault detector 105 or the ground fault detector 106 are sent to the CPU controller 111. The CPU controller 111 processes the signals and sends a fault event signal to the trip or tripping circuit 107. In response, the trip circuit 107 connects an actuating signal to terminal X2 to the primary coil 115. For example, trip voltage is applied to terminal X2 of the primary coil 115 by triggering a solid state switch in the trip circuit 107 to connect terminal X2 to the utility neutral power source 108. The CPU controller 111 may include a programmable microprocessor that may include a writeable memory and/or a read-only memory. The CPU controller 111 may include an application specific integrated circuit (ASIC) processor that may include a writeable memory and/or a read-only memory.

The primary coil 115 in the solenoid 113A is connected by terminals X1 and X2, and connected in series to the power supply circuit 104 in the circuit breaker 45 of FIG. 3A. The solenoid voltage applied to the primary coil 115 is an AC voltage that is maintained at a constant level and provides a constant background magnetization of the primary coil 115.

The secondary coil 101 is positioned within magnetic coupling distance from the primary coil 115, and has a secondary current induced therein when a primary current flows in the primary coil 115. The constant level AC solenoid voltage applied to the primary coil 115 and the primary current therein, produces a constant level of magnetic coupling between the primary coil 115 and the secondary coil 101 in air or free space. However, when a portion of the magnetic field passes through the ferromagnetic material of the plunger 100, which has a relatively large magnetic permeability, the magnetic flux between the primary coil 115 and the secondary coil 101 becomes distorted toward the ferromagnetic material, with the magnitude of the magnetic flux density passing through the material being multiplied by the value of the relatively large permeability and becomes concentrated in the region of the ferromagnetic material through which it passes.

Thus, the magnetic coupling between the primary coil 115 and the secondary coil 101 is affected by the position of the ferromagnetic plunger 100. In an example embodiment, as the plunger 100 moves toward the secondary coil 101, the induced voltage or current in the secondary coil 101 increases and as the plunger 100 moves away from the secondary coil 101, the induced voltage or current in the secondary coil 101 decreases. In response, the magnitude of the secondary current or sensing voltage of the secondary coil 101 indicates the position of the plunger 100 in the hollow body of the solenoid 113A. The secondary voltage or current is output to the core position sensing circuit 103. The core position sensing circuit 103 may include a burden resistor to convert the secondary current into the sensing voltage or directly measure the voltage across the secondary coil. The sensing voltage tracks the secondary current. An absence or reduction of the secondary current or sensing voltage of the secondary coil 101 indicates that there may be a faulty or broken connection in the primary coil 115.

The secondary coil 101 is connected by terminals X3 and X4 to the plunger position detecting circuit or core position sensing circuit 103 in FIG. 3C. The secondary coil 101 is positioned within magnetic coupling distance from the primary coil 115 and has a secondary voltage or current induced therein by means of the magnetic coupling to the primary voltage or current in the primary coil 115. The secondary coil is configured to produce a sensing voltage based on the background solenoid voltage applied to the primary coil 115.

The ferromagnetic plunger 100 positioned in the solenoid 113A, is configured to slide axially in the hollow body of the solenoid 113A, to trip the circuit breaker when the trip voltage or actuating signal is applied to the primary coil 115 to produce an actuating primary current in the primary coil 115. The resulting primary current has a magnitude sufficient to magnetize and propel the moveable plunger 100 and core attachment 116 to pull on the yoke 55 of the trip mechanism 114, to thereby open the main contacts of the circuit breaker.

The magnitude of the secondary current or sensing voltage of the secondary coil 101 indicates the position of the plunger 100 in the hollow body of the solenoid 113A. The range of the secondary current or sensing voltage of the secondary coil 101 may vary over a range of values that may depend on the number of turns of the windings for the primary and secondary coils, the dimensions of the hollow bobbin body, circuit breaker ambient temperature variations, and other environmental factors.

A wireless communication circuit 127 is connected to the CPU 111, to receive information on the plunger 100 position from the core position sensing circuit 103. The wireless communication circuit 127 is configured to wirelessly transmit information on at least one of electrical or mechanical states of the circuit breaker, based on the sensed position of the plunger 100 in the solenoid 113A. The transmitted information may include an identity of the branch circuit being monitored by the circuit breaker, based on identity information programmed into the memory of the CPU 111 at the time of installation of the circuit breaker. The wireless communication circuit 127 may be, for example, a Bluetooth transceiver that may communicate with a Bluetooth radio located nearby, for example in the same electrical panel as is located the circuit breaker. The wireless communication circuit 127 may wirelessly receive settings or programming instructions from a remote radio, for storage in the memory of the CPU 111. In an alternate embodiment, the communication circuit 127 may be a wired circuit that is connected by wire directly or indirectly to a controller, for example in the same electrical panel as is located the circuit breaker. The wired circuit may be configured to transmit information to the controller on at least one of electrical or mechanical states of the circuit breaker, based on the sensed position of the plunger 100 in the solenoid 113A.

FIG. 3C illustrates a more detailed example schematic circuit diagram of FIG. 3A and FIG. 3B, showing details of the breaker circuit 132 and the connection of the trip circuit 107 to the primary coil 115 and the power supply circuit 104. Trip voltage is applied to terminal X2 of the primary coil 115 by triggering a solid state switch in the trip circuit 107 to connect terminal X2 to the utility neutral power source 108. The connection is shown of the secondary coil 101 to the core position sensing circuit 103 of the solenoid 113A in the miniature circuit breaker, in an example embodiment of the disclosure. The constant background solenoid voltage applied by the power supply circuit 104 to the primary coil 115 produces the secondary voltage or current in the secondary coil 101 that is magnetically linked to the primary coil 115. The sensing voltage or current is applied to the core position censing circuit 103 that may include a burden resistor to convert the secondary voltage or current into the sensing voltage that is output to the CPU 111. The CPU 111 is programmed to determine whether any change in the sensing voltage or current indicates either a change in the position of the plunger 100 within the hollow body of the solenoid 113A or, alternately, an impending or actual failure of the primary coil 115. The CPU 111 processes this secondary sensing voltage and determines the next sequence of options in the breaker. The CPU 111 may send or activate the communication circuit 127 or LED 126 to transmit the proper information.

Figure 4A:
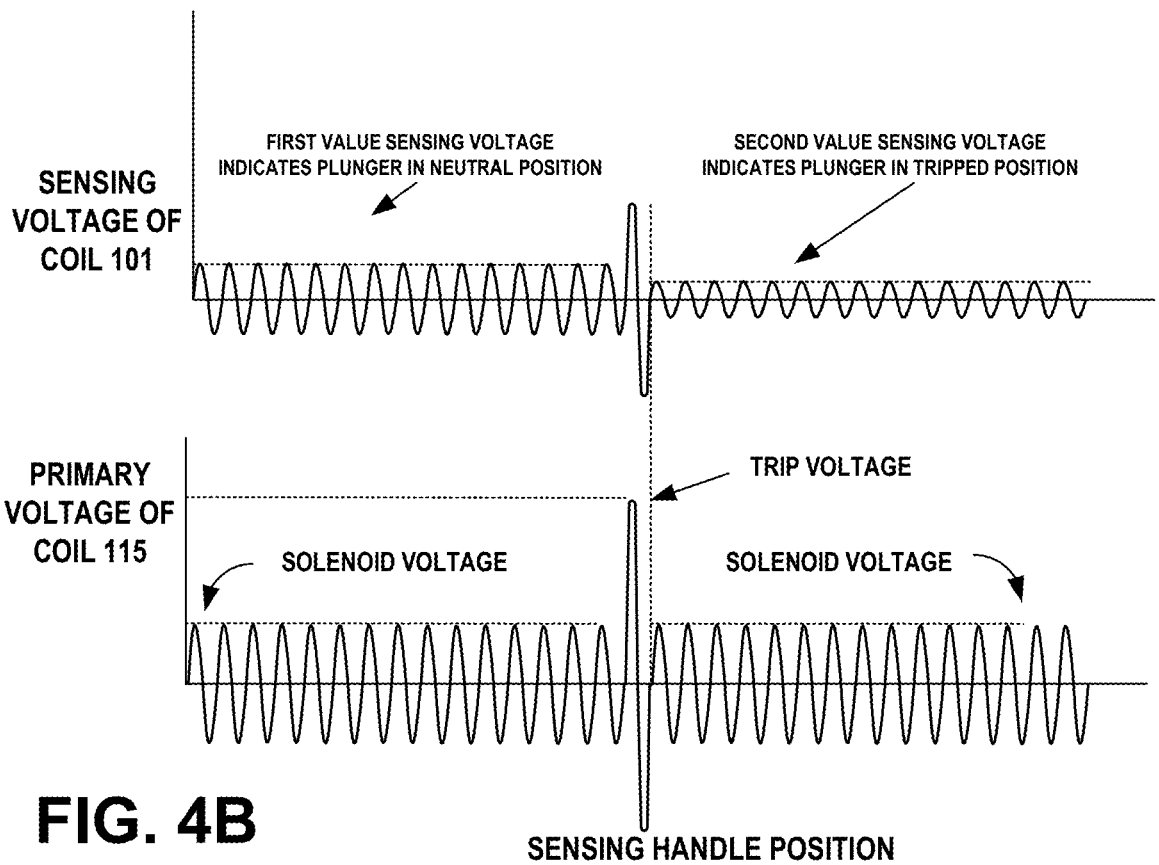
FIG. 4A illustrates an example graph of the primary voltage and the secondary current and sensing voltage in monitoring the position of the plunger in the moveable inner core solenoid 113A that is used for the trip solenoid in the miniature circuit breaker of FIG. 1A, wherein the solenoid includes a single primary coil and a secondary coil, in an example embodiment of the disclosure.

FIG. 4A illustrates an example graph of the primary voltage and the secondary current and sensing voltage in monitoring the position of the plunger 100 in the moveable inner core solenoid 113A that is used for the trip solenoid in the miniature circuit breaker 45 of FIG. 1A, wherein the solenoid 113A includes a single primary coil 115 and a secondary coil 101, in an example embodiment of the disclosure. The lower graph is of the primary voltage applied to the primary coil 115 vs time. The solenoid voltage is a constant magnitude background AC voltage as shown in the FIG. 3C. The primary voltage or current produces a constant primary voltage or current in the primary coil 115, which is sufficiently less in magnitude than that which would be necessary to move the plunger 100 so as to trip the circuit breaker.

The constant level of primary voltage or current in the primary coil 115 provides a constant background magnetization of the primary coil 115. The secondary coil 101 is positioned within magnetic coupling distance from the primary coil 115 and has a secondary voltage or current induced therein when a primary current flows in the primary coil 115. The constant level AC solenoid voltage applied to the primary coil 115 and the primary current therein, produces a constant level of magnetic coupling between the primary coil 115 and the secondary coil 101 in air or free space. However, when a portion of the magnetic field passes through the ferromagnetic material of the plunger 100, which has a relatively large magnetic permeability, the magnetic flux between the primary coil 115 and the secondary coil 101 becomes distorted toward the ferromagnetic material and becomes concentrated in the region of the ferromagnetic material of the plunger through which it passes. Thus, the magnetic coupling between the primary coil 115 and the secondary coil 101 is affected by the position of the ferromagnetic plunger 100. In response, the magnitude of the secondary current or sensing voltage of the secondary coil 101 indicates the position of the plunger 100 in the hollow body of the solenoid 113A.

In an example hollow body solenoid 113A, the primary coil 115 has a certain number of turns and the secondary coil 101 has an equal or different number of turns. The primary background AC voltage of primary coil 115 has an example magnitude voltage at a certain frequency. The action of moving the plunger 100 through the full length of the hollow body of the solenoid, may result in a change in the sensing voltage of the secondary coil 101. This is indicated by the upper graph of FIG. 4A, where the larger value of the sensing voltage indicates that the plunger 100 is in a neutral position corresponding to the main contacts of the breaker being closed. When an arc fault is detected by the arc fault detector 105 or a ground fault is detected by the ground fault detector 106, the CPU 111 signals the trip circuit 107 to output a trip voltage pulse to the primary coil 115. The trip voltage may be a large voltage produced by connection of the utility line 102 and utility neutral 108 power source directly to the primary coil 115, such as a transient voltage, within the solenoid to trip the circuit breaker. The lower graph of FIG. 4A shows an example trip voltage pulse applied to the primary coil 115.

In the upper graph of FIG. 4A the smaller, second value sensing voltage indicates that the plunger 100 is in the tripped position. After the occurrence of an arc fault or ground fault, the secondary current or sensing voltage is shown at a smaller magnitude of a second value that indicates the plunger 100 is in the tripped position corresponding to the main contacts of the breaker being tripped and open.

Figure 4B:
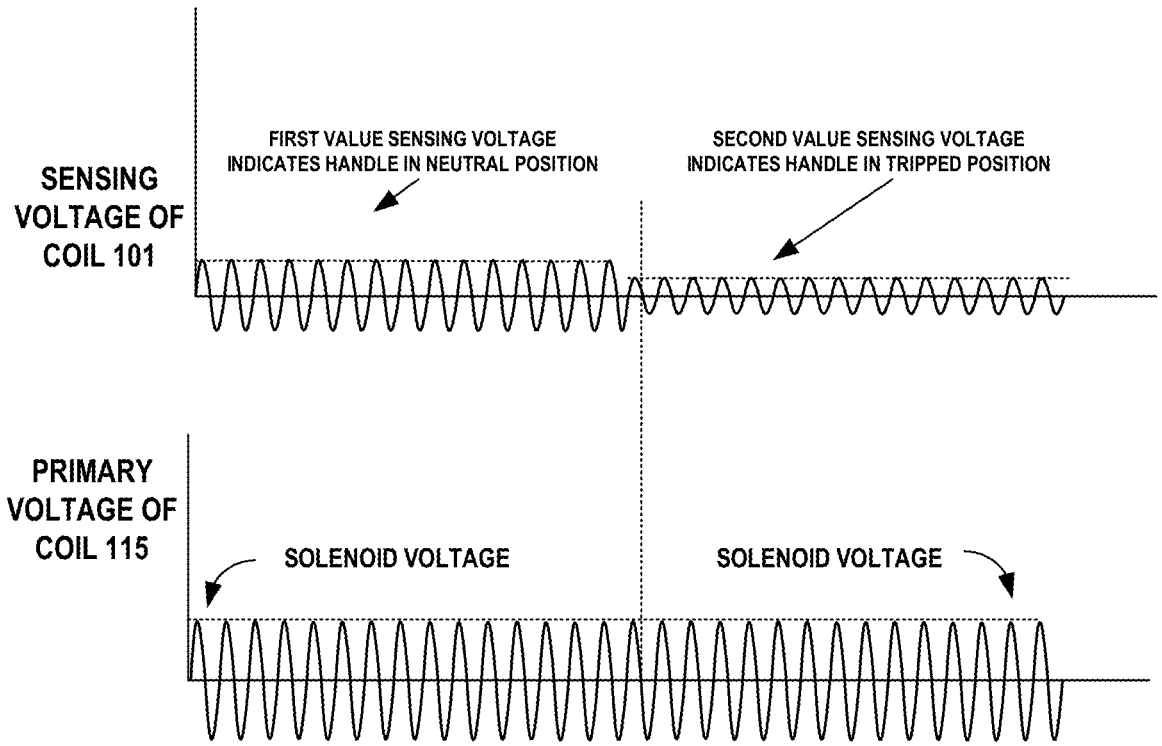
FIG. 4B illustrates an example graph of the primary voltage and the secondary current or sensing voltage in sensing the position of the handle of the circuit breaker, when the tripping event is a short circuit or over current, instead of an arc fault or ground fault, in the miniature circuit breaker, wherein the solenoid includes a single primary coil and a secondary coil as shown in of FIG. 1A, in an example embodiment of the disclosure.

FIG. 4B illustrates an example graph of the primary voltage and the secondary current or sensing voltage in sensing the position of the handle of the circuit breaker, when the tripping event is a short circuit or over current, instead of an arc fault or ground fault as shown in FIG. 4A. The handle 125 mechanically linked to the plunger 100 of the solenoid, and is configured to adopt a position indicating that the circuit breaker has tripped, in response to the position of the plunger 100 in the hollow body of the solenoid 113A. The magnitude of the sensing voltage of the secondary coil 101 indicates the position of the handle 125, in response to the position 100 of the plunger in the hollow body of the solenoid. For a thermal trip, the bimetal 53 within the yoke 55 is distorted by resistive heating heat and forces the latch plate 61 away from the trip lever 59. Since the plunger 100 is mechanically fastened to the yoke 55 on the trip mechanism 114, whenever the trip lever 59 is delatched, the plunger travels with the motion of the yoke 55. Thus, whenever the trip lever 59 is delatched, whether as a result of a short circuit or over current fault, or as a result of an arc or ground fault, the position of the plunger is moved from its neutral position to a tripped position. The magnitude of the sensing voltage of the secondary coil 101 indicates the position of the handle 125, in response to the position 100 of the plunger in the solenoid.

FIG. 4C illustrates an example graph of the primary voltage and the secondary current and sensing voltage in monitoring the continuity of the primary coil 115 in the moveable inner core solenoid 113A of FIG. 1A, wherein the solenoid 113A includes a single primary coil 115 and a secondary coil 101, in an example embodiment of the disclosure. The lower graph is of the primary voltage in primary coil 115 vs time. As shown in the graph of FIG. 4C, the magnitude of the primary voltage applied to the primary coil 115 may drop to zero due to a failure in integrity of the primary coil 115, either in the coil itself, or broken connection to the rest of the breaker circuit 132 of FIG. 3C. Correspondingly, the secondary current and sensing voltage of the secondary coil 101 also drops to zero. The plunger position detecting circuit or core position sensing circuit 103 connected to the secondary coil 101, then outputs an alarm signal to the CPU 111 of FIG. 3A, indicating a failed connectivity or broken connection in the primary coil 115 or in the circuit series to it. The wireless communication circuit 127 is configured to wirelessly transmit information on at least one of electrical or mechanical states of the circuit breaker, based on the sensed position of the plunger 100 in the solenoid 113A or the detection of a faulty primary coil 115.

FIG. 1C illustrates another example moveable inner core solenoid 113B that may be used as a trip solenoid in a miniature circuit breaker 45. The solenoid 113B includes two primary coils 115 and 118 in parallel (double winding solenoid) and a secondary coil 101, in an example embodiment of the disclosure. FIG. 1D illustrates a side view of the example moveable inner core solenoid 113B of FIG. 1C. The two primary coils 115 and 118 and the secondary coil 101 are wound about a hollow bobbin body that has a generally cylindrical shape and is made of a non-metallic, non-conductive material. A front wall forms one end of the bobbin and a rear wall forms the other end of the bobbin. Two disk shaped dividers are located on the bobbin between the front wall and the rear wall coaxial with the bobbin, one divider serves to separate the two primary coils 115 and 118 and the other divider serves to separate the secondary coil 101 from the primary coil 118. The secondary coil 101 is positioned within magnetic coupling distance from the primary coils 115 and 118, to produce a secondary current when a primary current flows in either one or both of the primary coils 115 and 118.

Figure 6A:
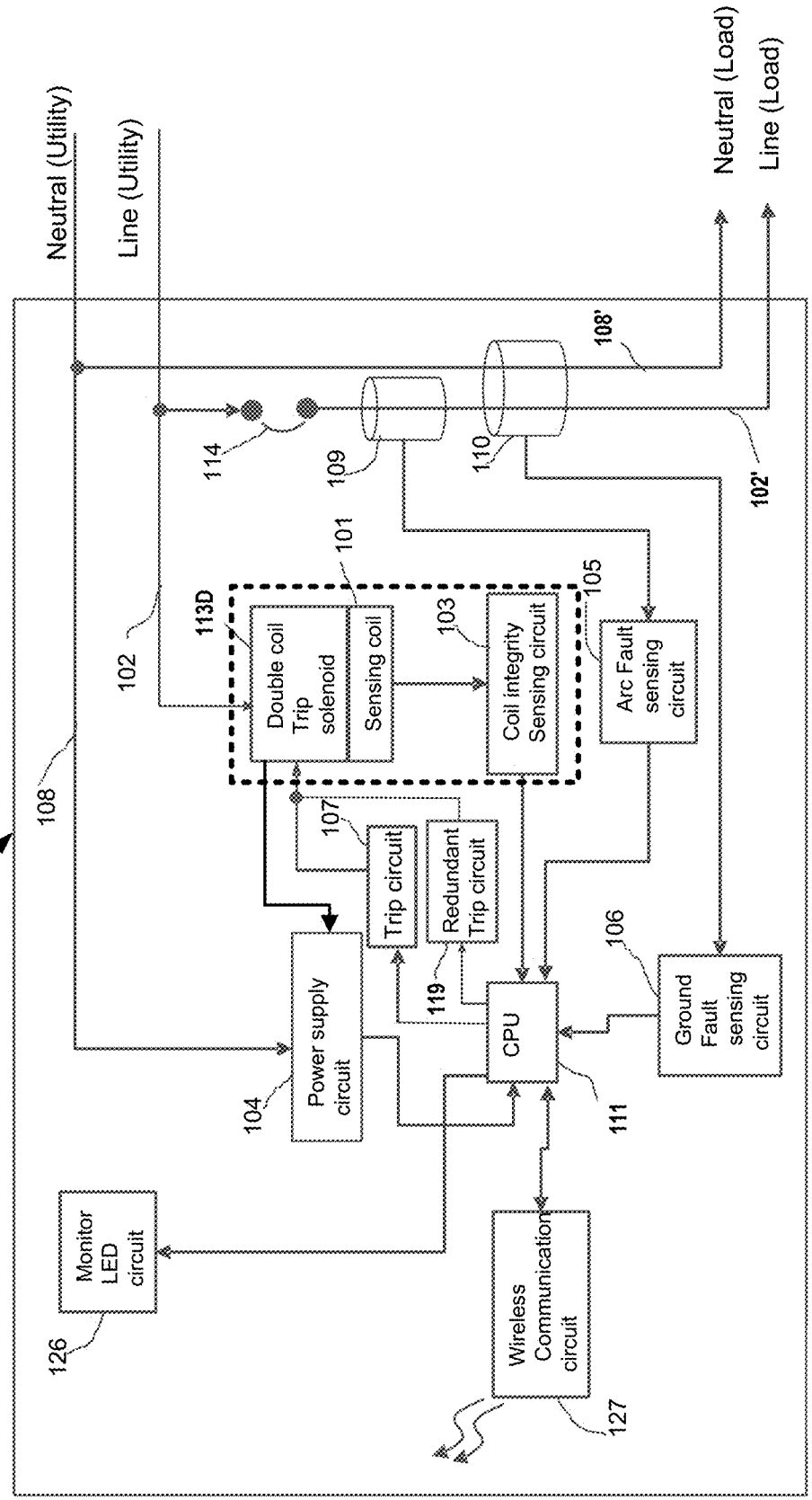
FIG. 6A illustrates an example schematic circuit diagram of the fault tripping components associated with the static core solenoid 113D of FIG. 5A having a double winding with two primary coils in a miniature circuit breaker, in an example embodiment of the disclosure.
Figure 6B:
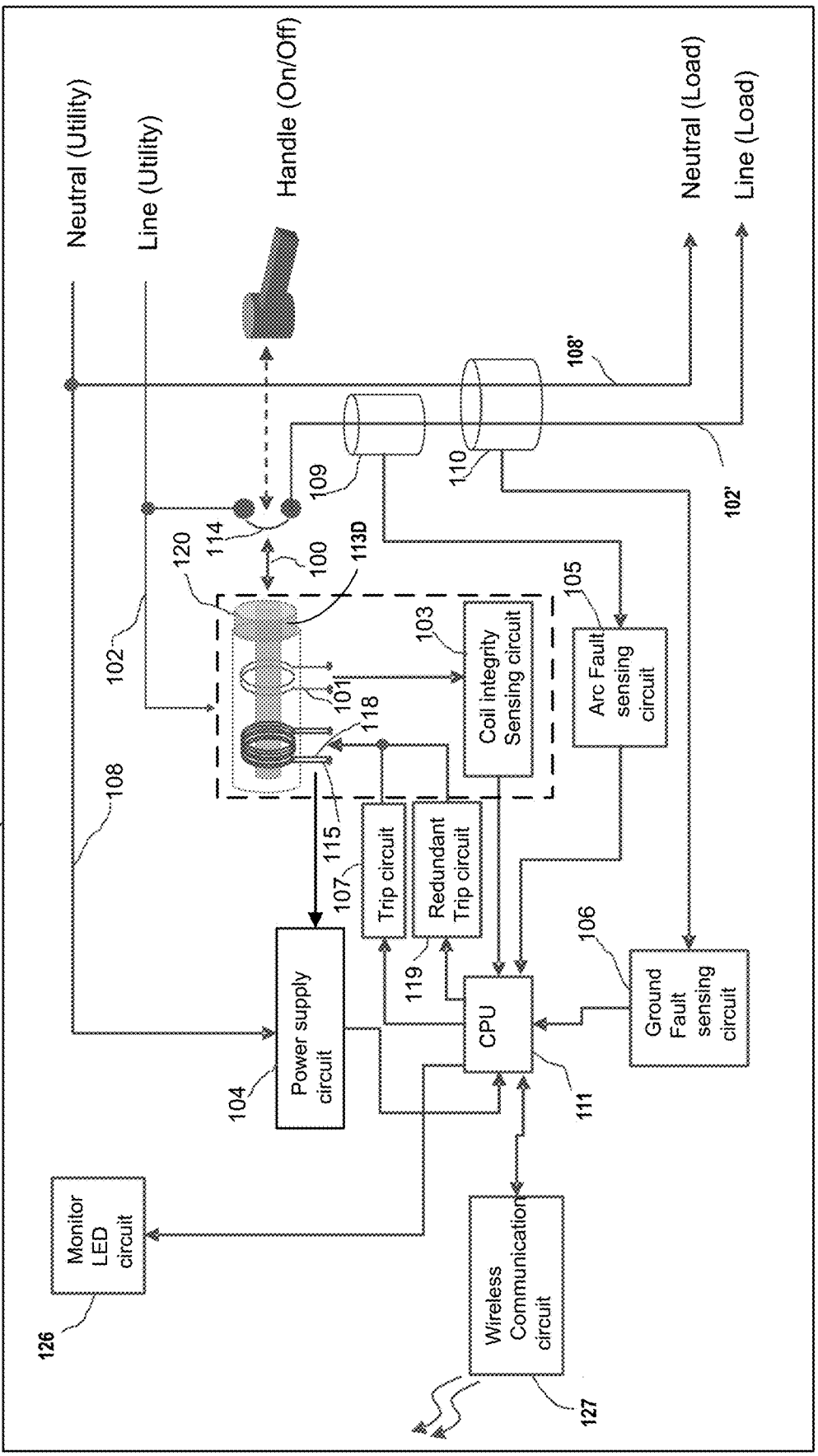
FIG. 6B illustrates an example schematic circuit diagram of the fault tripping components associated with the static core solenoid 113D of FIG. 5A having a double winding with two primary coils of FIG. 6A, showing details of the connections to the two primary coils and the secondary coil, wherein an absence or small magnitude of a secondary current in the secondary coil indicates that at least one of the two primary coils has a faulty or broken connection, in an example embodiment of the disclosure.

The primary coil 115 in the solenoid 113B may be connected by terminals X1 and X2 to the trip circuit 107 of FIG. 6B. The redundant primary coil 118 in the solenoid 113B may be connected by terminals X1' and X2' to the redundant trip circuit 119 of FIG. 6B. Fault detection signals from the arc fault detector 105 or the ground fault detector 106 are sent to the CPU controller 111 of FIG. 6B. The CPU controller 111 processes the signals and sends a fault event signal to the trip circuit 107 and to the redundant trip circuit 119. In response, the trip circuit 107 and the redundant trip circuit 119 output a trip voltage pulse or actuating signal to the terminals X1 and X2 of the primary coil 115 and to terminals X1' and X2' of the redundant primary coil 118.

The secondary coil 101 in the solenoid 113B is connected by terminals X3 and X4 to the plunger position detecting circuit or core position sensing circuit 103. The secondary coil 101 is positioned within magnetic coupling distance from the primary coil 115 and the redundant primary coil 118, to produce a secondary current when a primary current flows in either the primary coil 115 or the redundant primary coil 118.

The plunger position detecting circuit or core position sensing circuit 103 in the solenoid 113B is connected to the secondary coil 101, is configured to receive a secondary current from the secondary coil 101. The magnitude of the voltage or current in the secondary coil 101, which is proportional to the displacement of the plunger, indicates the position of the plunger 100 in the hollow body of the solenoid 113B.

FIG. 1E illustrates an example static core solenoid 113D that may be used for a trip solenoid in a miniature circuit breaker 45, wherein the solenoid 113D includes two primary coils 115 and 118 that are connected together in parallel, and a secondary coil 101, in an example embodiment of the disclosure. In static core tripping solenoids, the plunger 120 does not physically contact the trip assembly 114, but instead acts upon it magnetically, because the yoke 55 is ferromagnetic.

FIG. 1F illustrates a side view of the example static core solenoid 113D of FIG. 1E, in an example embodiment of the disclosure.

Figure 2B:
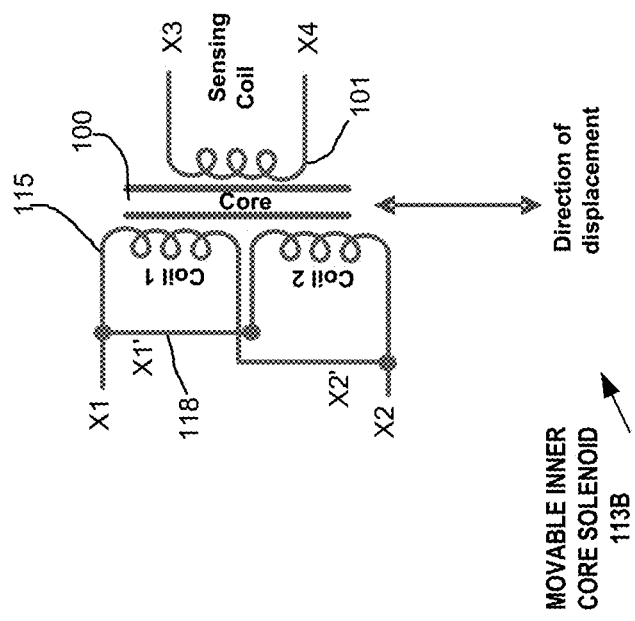
FIG. 2B illustrates the example schematic circuit diagram of the moveable inner core solenoid 113B of FIG. 2A, wherein the solenoid includes two primary coils that are connected together in parallel, in an example embodiment of the disclosure.
Figure 2A:
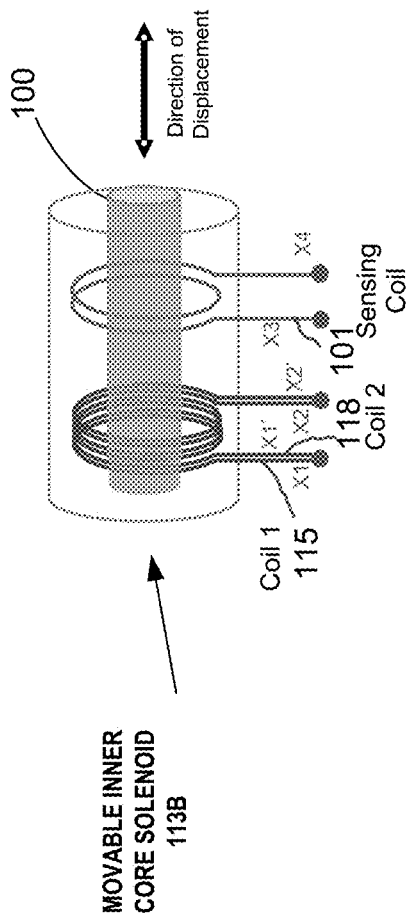
FIG. 2A illustrates the example moveable inner core solenoid 113B of FIG. 1C, showing the direction of displacement of the moveable inner core in response to an actuating primary current in the primary coil, in an example embodiment of the disclosure.

FIG. 2A illustrates the example moveable inner core solenoid 113B of FIG. 1C, showing the direction of displacement of the moveable inner core or plunger 100 in response to an actuating primary voltage or current in the parallel connected primary coils 115 and 118, in an example embodiment of the disclosure. The primary coil 115 is referred to as "coil 1", the redundant primary coil 118 is referred to as "coil 2", and the secondary coil 101 is referred to as "sensing coil" in FIG. 2A and in the circuit schematic diagram of FIG. 2B.

FIG. 2B illustrates the example schematic circuit diagram of the moveable inner core solenoid 113B of FIG. 2A, wherein the solenoid 113B includes two primary coils 115 and 118 that are connected together in parallel, in an example embodiment of the disclosure. When the trip circuit sends a fault signal current through the coils 115/118, the trip solenoid 113 is magnetized and propels the moveable plunger 100 to press against or pull on the trip mechanism, thereby opening the main contacts of the circuit breaker.

FIG. 5A illustrates an example static core solenoid 113D having a double winding with two primary coils, coil 1A and coil 1B comprise primary coil 115 and coil 2A and coil 2B comprise redundant primary coil 118, and a secondary coil 101, in an example embodiment of the disclosure.

Figure 6C:
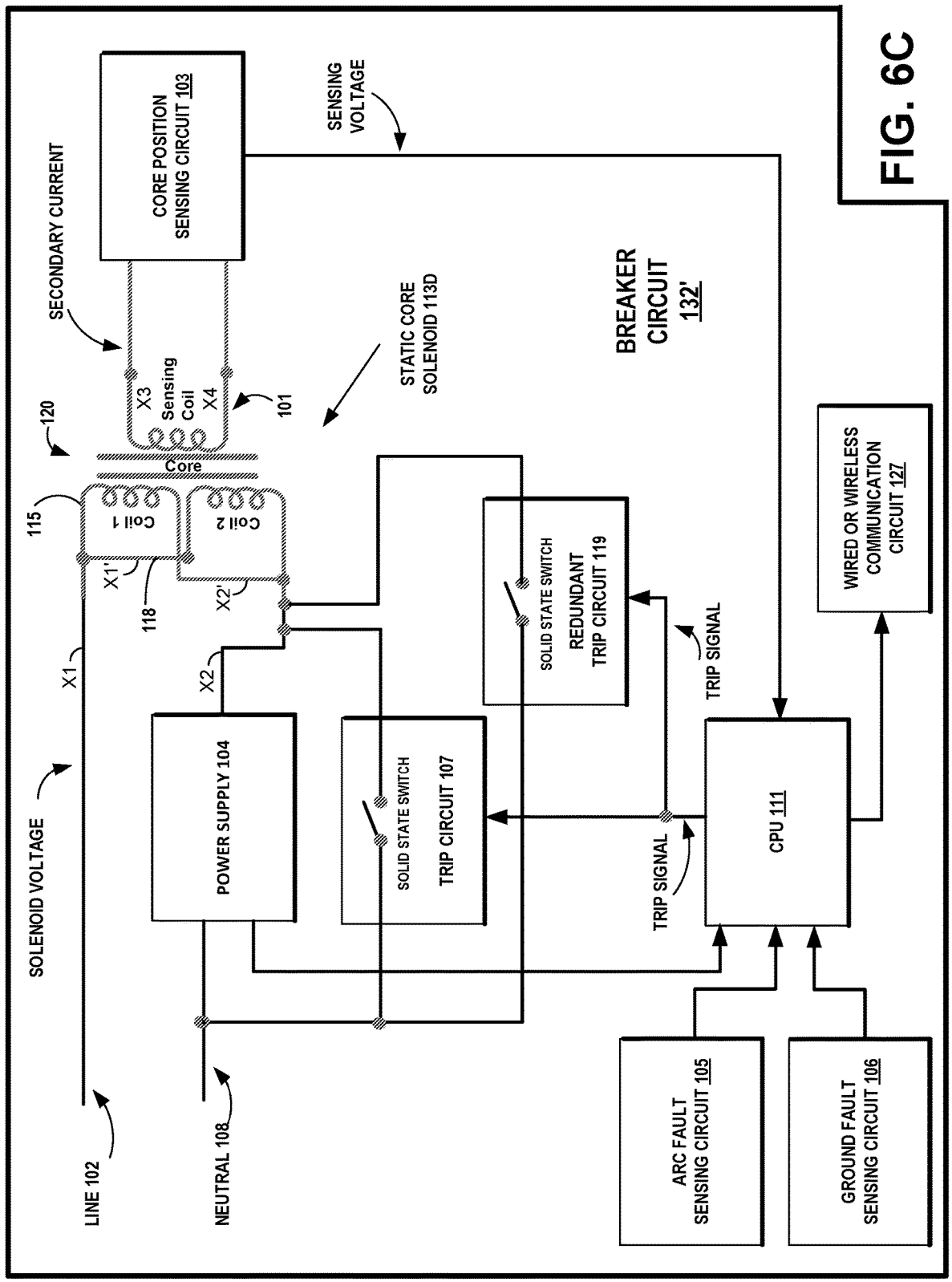
FIG. 6C illustrates a more detailed example schematic circuit diagram of FIG. 6B, showing details of connection of the primary coil, the redundant coil, and the sensing coil to the rest of the breaker circuit, illustrating the connection of the primary coil (coil 1) to the trip circuit, the redundant coil (coil 2) to the redundant trip circuit, and the connection of the secondary coil to the core position sensing circuit of the solenoid in a miniature circuit breaker, in an example embodiment of the disclosure.

FIG. 5B illustrates an example schematic circuit diagram of the static core solenoid 113D of FIG. 5A, having a double winding with the two primary coils, wherein the presence and magnitude of a secondary current in the secondary coil 101 indicates that both of the two primary coils 115 and 118 have good connections to the rest of the breaker circuit 132' of FIG. 6C, in an example embodiment of the disclosure.

FIG. 5C illustrates an example schematic circuit diagram of the static core solenoid 113D of FIG. 5A, having a double winding with the two primary coils, wherein the absence or small magnitude of a secondary current in the secondary coil 101 indicates that at least one of the two primary coils 115 or 118 has a faulty or broken connection to the rest of the breaker circuit 132' of FIG. 6C, in an example embodiment of the disclosure.

FIG. 6A illustrates an example schematic circuit diagram of the fault tripping components associated with the static core solenoid 113D of FIG. 5A having a double winding with two primary coils in a miniature circuit breaker, in an example embodiment of the disclosure.

FIG. 6B illustrates an example schematic circuit diagram of the fault tripping components associated with the static core solenoid 113D of FIG. 5A having a double winding with two primary coils of FIG. 5A, showing details of the connections to the two primary coils and the secondary coil, in an example embodiment of the disclosure.

The primary coil 115 in the static core solenoid 113D may be connected by terminal X2 to the trip circuit 107 of FIG. 6B (as shown in FIG. 6C). The redundant primary coil 118 in the solenoid 113D may be connected by terminal X2' to the redundant trip circuit 119 of FIG. 6B (as shown in FIG. 6C). Fault detection signals from the arc fault detector 105 or the ground fault detector 106 are sent to the CPU controller 111 of FIG. 6B. The CPU controller 111 processes the signals and sends a fault event signal to the trip circuit 107 and to the redundant trip circuit 119. In response, the trip circuit 107 and the redundant trip circuit 119 connect the utility neutral power 108 directly on the X2 and X2' terminals, which apply the trip voltage to the primary coil 115 and to terminal X2' of the redundant primary coil 118.

The secondary coil 101 in the static core solenoid 113D is connected by terminals X3 and X4 in FIG. 1E to the coil integrity sensing circuit 103. The secondary coil 101 is positioned within magnetic coupling distance from the primary coil 115 and the redundant primary coil 118, to produce a secondary current when a primary current flows in either the primary coil 115 or the redundant primary coil 118.

The coil integrity sensing circuit 103 in the solenoid 113D is connected to the secondary coil 101, is configured to receive a secondary voltage or current from the secondary coil 101. The magnitude of the voltage or current in the secondary coil 101 indicates the integrity of the primary coils 115 and 118 in the solenoid 113D. A monitor LED circuit 126 connected to the CPU 111, may display whether the primary coil 115 or the redundant primary coil 118 is broken or faulty.

FIG. 6C illustrates a more detailed example schematic circuit diagram of FIG. 6B, showing details of connection of the primary coil 115, the redundant coil 118, and the sensing coil 101 to the rest of the breaker circuit 132'. FIG. 6C illustrates the connection of the primary coil 115 (coil 1) to the trip circuit 107, the redundant coil 118 (coil 2) to the redundant trip circuit 119, and the connection of the secondary coil 101 to the core position sensing circuit 103 of the solenoid in a miniature circuit breaker. Trip voltage is applied to terminal X2 of the primary coil 115 (coil 1) by triggering a solid state switch in the trip circuit 107 to connect terminal X2 to the utility neutral power source 108. Trip voltage is applied to terminal X2' of the redundant primary coil 118 (coil 2) by triggering a solid state switch in the redundant trip circuit 119 to connect terminal X2' to the utility neutral power source 108.

FIG. 7 illustrates an example graph of the primary current and the secondary current in monitoring the integrity of both the primary coil 115 and the redundant primary coil 118 in the static core solenoid 113D of FIG. 5A, wherein the solenoid 113D includes a double winding with two primary coils and the secondary coil, in an example embodiment of the disclosure.

The lowest graph is of the primary voltage of the primary coil 115 vs time. The middle graph is of the primary current in the redundant primary coil 118 vs time. As shown in the graph of FIG. 7, the magnitude of the primary current applied to the primary coil 115 drops to zero due to a failure in connectivity or integrity of the primary coil 115, either in the coil itself, or in the connections to the rest of the breaker circuit 132' of FIG. 6C. The magnitude of the primary voltage or current applied to the redundant primary coil 118 remains steady. Correspondingly, the secondary current in the secondary coil 101 drops from a greater value to a lesser value due to the loss of the voltage or current in primary coil 115. The coil integrity sensing circuit 103 connected to the secondary coil 101, then outputs an alarm signal to the CPU 111 of FIG. 6B, indicating a failed connectivity or broken connection between the breaker circuit 132 and one of the two primary coils 115 or 118.

The resulting apparatus and system provide information on the position of the handle of the circuit breaker when a short circuit, overload fault event occurs or any physical manipulation of the handle. Moreover, the resulting apparatus and system can indicate that there is a faulty or broken connection between a breaker circuit 132 and the primary coil 115.

In the preceding, reference is made to various embodiments. However, the scope of the present disclosure is not limited to the specific described embodiments. Instead, any combination of the described features and elements, whether related to different embodiments or not, is contemplated to implement and practice contemplated embodiments. Furthermore, although embodiments may achieve advantages over other possible solutions or over the prior art, whether or not a particular advantage is achieved by a given embodiment is not limiting of the scope of the present disclosure. Thus, the preceding aspects, features, embodiments and advantages are merely illustrative and are not considered elements or limitations of the appended claims except where explicitly recited in a claim(s).

It is to be understood that the above description is intended to be illustrative, and not restrictive. Many other implementation examples are apparent upon reading and understanding the above description. Although the disclosure describes specific examples, it is recognized that the systems and methods of the disclosure are not limited to the examples described herein but may be practiced with modifications within the scope of the appended claims. Accordingly, the specification and drawings are to be regarded in an illustrative sense rather than a restrictive sense. The scope of the disclosure should, therefore, be determined with reference to the appended claims, along with the full scope of equivalents to which such claims are entitled.

What is claimed is:

1. An apparatus for determining a state of a tripping solenoid in a circuit breaker, comprising:
a primary coil wound around a hollow body of a solenoid, the primary coil connected in series to a line voltage and a power supply, and coupled to a tripping circuit in the circuit breaker, the tripping circuit configured to apply a trip voltage to the primary coil when a fault condition is detected in a circuit monitored by the circuit breaker;
a secondary coil wound around the hollow body of the solenoid, the secondary coil positioned within magnetic coupling distance from the primary coil, configured to produce a sensing voltage based on the primary coil voltage;
a ferromagnetic plunger positioned in the hollow body of the solenoid, configured to slide axially to a tripped position in the hollow body to trip the circuit breaker when the trip voltage is applied to the primary coil; and
a plunger position detecting circuit connected to the secondary coil, configured to detect the position of the plunger in the hollow body of the solenoid based on the sensing voltage.

2. The apparatus of claim 1, further comprising:
a handle mechanically linked to the plunger of the solenoid, configured to adopt a position indicating that the circuit breaker has tripped or any change of state in the handle position, in response to the position of the plunger in the hollow body of the solenoid; and
wherein the magnitude of the sensing voltage of the secondary coil indicates the position of the handle, in response to the position of the plunger in the hollow body of the solenoid.

3. The apparatus of claim 1, wherein an absence or reduction of the sensing voltage of the secondary coil indicates a faulty or broken connection in the primary coil.

4. The apparatus of claim 1, further comprising:
a second primary coil wound around the hollow body of the solenoid, the second primary coil connected in parallel with the first said primary coil and positioned within magnetic coupling distance from the secondary coil;
wherein an absence or reduction of the sensing voltage of the secondary coil indicates a faulty or broken connection in at least one of the first said primary coil and the second primary coil; and,
wherein the magnitude of the sensing voltage of the secondary coil indicates the position of the handle, in response to the position of the plunger in the hollow body of the solenoid.

5. The apparatus of claim 1, further comprising:
a wireless or wired communication circuit coupled to the plunger position detecting circuit, configured to transmit information on at least one of electrical or mechanical states of the circuit breaker.

6. An apparatus for determining a state of a primary coil in a circuit breaker, comprising:
a primary coil wound around a hollow body of a solenoid, the primary coil connected in series to a line voltage and a power supply, and coupled to a tripping circuit in the circuit breaker, the tripping circuit configured to apply a trip voltage to the primary coil when a fault condition is detected in a circuit monitored by the circuit breaker;
a secondary coil wound around the hollow body of the solenoid, the secondary coil positioned within magnetic coupling distance from the primary coil, configured to produce a sensing voltage based on the primary coil voltage;
a static ferromagnetic plunger positioned in the hollow body of the solenoid, configured to produce a magnetic field to cause the circuit breaker to trip when the trip voltage is applied to the primary coil; and
a detecting circuit connected to the secondary coil, configured to detect an absence or reduction of the sensing voltage of the secondary coil indicating a faulty or broken connection in the primary coil.

7. The apparatus of claim 6, further comprising:
a second primary coil wound around the hollow body of the solenoid, the second primary coil connected in parallel with the first said primary coil and positioned within magnetic coupling distance from the secondary coil;
wherein an absence or reduction of the sensing voltage of the secondary coil indicates a faulty or broken connection in at least one of the first said primary coil or the second primary coil.

8. The apparatus of claim 6, further comprising:
a wireless or wired communication circuit coupled to the detecting circuit, configured to transmit information on at least one of electrical or mechanical states of the circuit breaker.

9. An apparatus for determining a state of a tripping solenoid in a circuit breaker, comprising:
a primary coil wound around a hollow body of a solenoid, the primary coil connected in series to a line voltage and a power supply, and coupled to a tripping circuit in the circuit breaker, the tripping circuit configured to apply a trip voltage to the primary coil when a fault condition is detected in a circuit monitored by the circuit breaker;
a secondary coil wound around the hollow body of the solenoid, the secondary coil positioned within magnetic coupling distance from the primary coil, configured to produce a sensing voltage based on the primary coil voltage;
a ferromagnetic plunger positioned in the hollow body of the solenoid, configured to slide axially to a tripped position in the hollow body to trip the circuit breaker when the trip voltage is applied to the primary coil;
the ferromagnetic plunger positioned in the hollow body of the solenoid, configured to slide axially to any handle position in the hollow body while a solenoid voltage is applied to the primary coil; and
a computer processor and a memory programmed with computer instructions for execution by the processor, coupled to the secondary coil, configured to detect the position of the plunger in the hollow body of the solenoid based on the sensing voltage;
wherein the computer processor is programmed to determine whether any change in the sensing voltage indicates either a change in the position of the plunger within the hollow body of the solenoid or, alternately, an impending or actual failure of the primary coil.

10. The apparatus of claim 9, wherein the processor is programmed to determine whether the sensing voltage has been reduced or is substantially zero, indicating one or both of the windings in the trip solenoid is faulty, but the circuit breaker continues to detect arc faults or ground faults, wherein the processor is configured to send an external signal through either a communicating circuit or an LED circuit to indicate a problem with the circuit breaker.

11. The apparatus of claim 9, wherein the processor is programmed to determine whether the sensing voltage has changed and whether there is no indication of an arc fault or a ground fault, indicating that there has been a tripping event by either an over current, a short circuit, or any handle manipulation event that will have tripped a handle of the circuit breaker into its tripped position.

12. The apparatus of claim 9, wherein the processor is programmed to determine whether an arc fault or a ground fault has occurred, and in response, cause a trip voltage pulse to be applied to the primary coil to move the plunger within the solenoid to trip the circuit breaker.

* * * * *